(12) United States Patent
Huangfu et al.

(10) Patent No.: US 11,076,408 B2
(45) Date of Patent: Jul. 27, 2021

(54) INFORMATION TRANSMISSION METHOD, NETWORK DEVICE, AND TERMINAL DEVICE

(71) Applicant: HUAWEI TECHNOLOGIES CO., LTD., Guangdong (CN)

(72) Inventors: Yourui Huangfu, Hangzhou (CN); Hejia Luo, Hangzhou (CN); Jian Wang, Hangzhou (CN); Huazi Zhang, Hangzhou (CN); Rong Li, Hangzhou (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/579,598

(22) Filed: Sep. 23, 2019

(65) Prior Publication Data

US 2020/0022146 A1    Jan. 16, 2020

Related U.S. Application Data

(63) Continuation of application No. PCT/CN2018/080120, filed on Mar. 23, 2018.

(30) Foreign Application Priority Data

Mar. 24, 2017    (CN) .......................... 201710184668.X

(51) Int. Cl.
*H04W 72/04* (2009.01)
*H04W 76/11* (2018.01)
(Continued)

(52) U.S. Cl.
CPC ....... *H04W 72/0466* (2013.01); *H03M 13/13* (2013.01); *H04L 1/0061* (2013.01);
(Continued)

(58) Field of Classification Search
CPC ........... H04W 72/0466; H04W 72/042; H04W 72/1257; H04W 72/1278; H04W 76/11;
(Continued)

(56) References Cited

U.S. PATENT DOCUMENTS 9,066,340 B2 *    6/2015   Joung ................... H04L 1/0045
10,548,124 B2 *   1/2020   Chen ..................... H04W 74/02
(Continued)

FOREIGN PATENT DOCUMENTS

CN      101801090 A      8/2010
CN      101883369 A     11/2010
(Continued)

OTHER PUBLICATIONS

3GPP TS 36.213 V14.2.0 (Mar. 2017), 3rd Generation Partnership Project; Technical Specification Group Radio Access Network; Evolved Universal Terrestrial Radio Access (E-UTRA); Physical layer procedures(Release 14), 454 pages.
(Continued)

*Primary Examiner* — Wutchung Chu
(74) *Attorney, Agent, or Firm* — Womble Bond Dickinson (US) LLP

(57) ABSTRACT

This application provides an information transmission method, a network device, and a terminal device. The method includes: generating, by a network device, downlink control information DCI; determining, by the network device, a corresponding processing manner based on a format of the DCI; performing, by the network device, processing in the processing manner in an encoding process of the DCI; and sending, by the network device, the processed DCI over a physical downlink control channel PDCCH. The information transmission method provided in this application can resolve a problem of a failure in blind detection on DCI caused by a nested encoding feature of
(Continued)

polar encoding. When a terminal device cannot determine the format of the DCI sent by the network device, the network device may use a mapping relationship, and the network device processes DCI of a format in a processing manner.

9 Claims, 13 Drawing Sheets

(51) Int. Cl.
    *H03M 13/13*     (2006.01)
    *H04L 1/00*     (2006.01)

(52) U.S. Cl.
    CPC ......... *H04L 1/0064* (2013.01); *H04W 72/042* (2013.01); *H04W 76/11* (2018.02)

(58) Field of Classification Search
    CPC .. H04W 72/085; H04L 1/0038; H04L 1/0057; H04L 1/0061; H04L 1/0064; H04L 1/0072; H04L 5/0053; H04L 5/0096; H03M 13/13
    See application file for complete search history.

(56) References Cited

U.S. PATENT DOCUMENTS

| | | | |
|---|---|---|---|
| 2011/0171985 A1* | 7/2011 | Papasakellariou | H04W 72/0453 455/509 |
| 2011/0283171 A1* | 11/2011 | Slew | H04L 1/0072 714/807 |
| 2013/0044727 A1* | 2/2013 | Nory | H04L 5/0092 370/330 |
| 2013/0107809 A1* | 5/2013 | Ko | H04L 5/0053 370/328 |
| 2013/0148623 A1 | 6/2013 | Nishio et al. | |
| 2014/0050192 A1* | 2/2014 | Kim | H04L 5/001 370/329 |
| 2014/0219202 A1* | 8/2014 | Kim | H04W 72/0413 370/329 |
| 2016/0073339 A1* | 3/2016 | Tabet | H04L 1/0003 370/311 |
| 2016/0173231 A1* | 6/2016 | Yasukawa | H04L 1/0061 455/424 |
| 2016/0205669 A1 | 7/2016 | Kusashima et al. | |
| 2016/0249337 A1* | 8/2016 | Liang | H04W 72/042 |
| 2018/0192403 A1* | 7/2018 | Shelby | H03M 13/13 |
| 2018/0234204 A1* | 8/2018 | Nammi | H04L 1/0003 |
| 2018/0270722 A1* | 9/2018 | Kim | H04W 72/10 |
| 2018/0317234 A1* | 11/2018 | Lindoff | H04W 72/085 |
| 2018/0351579 A1* | 12/2018 | Hong | H03M 13/13 |
| 2019/0150187 A1* | 5/2019 | Park | H04W 72/1273 370/330 |
| 2019/0327012 A1* | 10/2019 | Park | H04W 76/11 |
| 2019/0373589 A1* | 12/2019 | Hwang | H04L 1/00 |
| 2020/0028630 A1* | 1/2020 | Beale | H04L 1/188 |
| 2020/0059905 A1* | 2/2020 | Tang | H04B 7/0486 |

FOREIGN PATENT DOCUMENTS

| | | |
|---|---|---|
| CN | 102186193 A | 9/2011 |
| CN | 103069905 A | 4/2013 |
| CN | 105393624 A | 3/2016 |
| CN | 106034015 A | 10/2016 |
| EP | 2377359 A1 | 10/2011 |
| EP | 2582074 A2 | 4/2013 |
| EP | 3026957 A1 | 6/2016 |
| WO | 2011153700 A1 | 12/2011 |
| WO | 2016122786 A1 | 8/2016 |

OTHER PUBLICATIONS

Yaozhen Nian, Key Techniques and Performance of PDCCH Channel for Broadband Wireless Trunking System. University of electronic science and technology of China, Mar. 15, 2016, 132 pages.
ATandT: "Polar Code Design for DCI" ,3GPP Draft; R1-1702277, Feb. 12, 2017,total 3 pages.
Coherent Logix Inc: "Early block discrimination with polar codes to further accelerate DCI blind detection",3GPP Draft; R1-1701897, Feb. 12, 2017,total 5 pages.

* cited by examiner

INFORMATION TRANSMISSION METHOD, NETWORK DEVICE, AND TERMINAL DEVICE

CROSS-REFERENCE TO RELATED APPLICATIONS

This application is a continuation of International Application No. PCT/CN2018/080120, filed on Mar. 23, 2018, which claims priority to Chinese Patent Application No. 201710184668.X, filed on Mar. 24, 2017. The disclosures of the aforementioned applications are hereby incorporated by reference in their entireties.

TECHNICAL FIELD

This application relates to the communications field, and more particularly, to an information transmission method, a network device, and a terminal device.

BACKGROUND

A physical downlink control channel (PDCCH) transmits control information related to a physical uplink/downlink shared channel, namely, downlink control information (DCI). The DCI includes related content such as resource block (RB) allocation information and a modulation method. Only after obtaining the DCI through correct decoding, a terminal can correctly process data related to the physical uplink/downlink shared channel.

User equipment (UE) needs to listen to a PDCCH sent by a base station (BS) to obtain DCI. Therefore, listening is always required, and power consumption for performing listening and decoding on the PDCCH affects power consumption of the UE that is in a standby state. Second, the UE end requires a relatively minimum PDCCH decoding time, to ensure plenty of time for decoding a data part. A PDCCH in a long term evolution (LTE) system is rate-matched and modulated through tail biting convolutional coding (TBCC), and then is mapped to an available physical resource location. The UE does not know a resource location at which the BS places the PDCCH, and needs to perform blind detection on a potential location of the PDCCH. TBCC decoding and cyclic redundancy check (CRC) need to be performed once for each time of blind detection, and a maximum of dozens of blind detection times need to be performed. Each test increases a false alarm rate (FAR) of the CRC on the PDCCH. Therefore, an FAR in an actual system depends on a maximum quantity of blind detection times required. No final conclusion has been fully reached on PDCCH design in a 5G system, but there may also be a part on which blind detection needs to be performed.

In an LTE system, search space of a PDCCH presents a particular regularity, each aggregation level has a plurality of potential PDCCH locations, and a quantity of the plurality of potential PDCCH locations is an even number. In a same aggregation level, lengths (which are denoted as N) of rate-matched encoded bits (bit) at the plurality of potential locations are consistent, and there are two possibilities for an information bit length (which is denoted as K). However, for a combination with same (N, K), that is, for same user equipment in a same state and a same transmission mode, an attempt needs to be made on at least two potential locations.

The UE does not know in advance a format of DCI carried in a received PDCCH, and does not know a location at which required information is located either. However, the UE knows a state in which the UE lies and DCI that the UE expects to receive in the state. When performing blind detection in the search space of the PDCCH, the UE needs to attempt to decode only a DCI format that possibly appears, and does not need to perform matching on all DCI formats. The DCI format that possibly appears depends on information that the UE expects to receive and a transmission mode.

For the same user equipment in the same state and the same transmission mode, there are still two possible DCI formats that need to be blindly detected. Currently, a polar code has become an encoding manner for control information in a 5th generation (5G) system, and in actual work, a decoding manner of the polar code is successive cancellation list (SCL) decoding. In this case, because of a nested encoding feature of the polar code, the two DCI formats are possibly indistinguishable (as an example, CRCs for two pieces of DCI are the same). As a result, the UE cannot learn of a correct DCI format, and further cannot correctly parse content of DCI. Consequently, communication of the UE is affected.

SUMMARY

This application provides an information transmission method, a network device, and a terminal device, to resolve a problem of a failure in blind detection on DCI caused by a nested encoding feature of a polar code.

According to a first aspect, an information transmission method is provided. The method includes: generating, by a network device, downlink control information (DCI); determining, by the network device, a corresponding processing manner based on a format of the DCI; performing, by the network device, processing in the processing manner in an encoding process of the DCI; and sending, by the network device, the processed DCI over a physical downlink control channel (PDCCH).

The information transmission method according to the first aspect can resolve a problem of a failure in blind detection on DCI caused by a nested encoding feature of a polar code. When a terminal device cannot determine the format of the DCI sent by the network device, the network device may use a mapping relationship, and use processing manners related to DCI formats, to resolve the problem of the failure in blind detection on DCI. That is, the network device processes DCI of a format in a processing manner. After a processing manner of the terminal device corresponds to the processing manner of the network device, a type of the DCI can be determined. That is, blind detection may succeed.

In one embodiment, the processing manner includes: scrambling a cyclic redundancy check (CRC) code of the DCI by using a sequence that corresponds to the format of the DCI; and/or performing bit reordering and/or resetting that corresponds to the format of the DCI on all or a part of a CRC code of the DCI.

In one embodiment, the processing manner includes: scrambling a radio network temporary identifier (RNTI) of the DCI by using a sequence that corresponds to the format of the DCI; and/or performing bit reordering and/or resetting that corresponds to the format of the DCI on all or a part of an RNTI, and scrambling a cyclic redundancy check CRC code of the DCI by using the processed RNTI.

In one embodiment, the determining, by the network device, a corresponding processing manner based on a format of the DCI includes: scrambling, by using the sequence that corresponds to the format of the DCI, all or some of frozen bits used in polar code encoding on the DCI;

and/or performing bit reordering and/or resetting that corresponds to the format of the DCI on all or some of frozen bits used in polar code encoding on the DCI.

According to a second aspect, an information transmission method is provided. The method includes: detecting, by a terminal device, a physical downlink control channel (PDCCH), where the PDCCH includes DCI; determining, by the terminal device, a processing manner set, where the processing manner set includes a plurality of possible DCI formats and a plurality of processing manners, where each possible DCI format corresponds to a processing manner; and decoding, by the terminal device, the PDCCH by sequentially using the possible DCI formats and the corresponding processing manners that are in the processing manner set.

The information transmission method according to the second aspect can resolve a problem of a failure in blind detection on DCI caused by a nested encoding feature of a polar code. When the terminal device cannot determine the format of the DCI sent by a network device, the terminal device uses processing related to DCI formats and uses a mapping relationship between an operation or information and a DCI format, to resolve the problem of the failure in blind detection on DCI. The terminal device separately decodes the PDCCH in processing manners that correspond to possible formats of the DCI. When a processing manner of the terminal device that can perform decoding correctly is determined, a type of the DCI can be determined, so that content of the DCI can be parsed.

In one embodiment, the processing manner includes: descrambling a CRC code of the DCI by using a sequence related to a format of the DCI that corresponds to the processing manner; and/or performing bit de-reordering and/or de-resetting that corresponds to a format of the DCI that corresponds to the processing manner on all or a part of a CRC code of the DCI.

In one embodiment, the processing manner includes: descrambling a RNTI of the DCI by using a sequence that corresponds to a format of the DCI that corresponds to the processing manner; and/or performing bit de-reordering and/or de-resetting that corresponds to a format of the DCI that corresponds to the processing manner on all or a part of a RNTI of the DCI, and descrambling a CRC code of the DCI by using the processed RNTI.

In one embodiment, the processing manner includes: descrambling, by using the sequence that corresponds to the format of the DCI that corresponds to the processing manner, all or some of frozen bits used in polar code decoding on the PDCCH; and/or performing bit de-reordering and/or de-resetting that corresponds to the format of the DCI that corresponds to the processing manner on all or some of frozen bits used in polar code decoding on the PDCCH.

In one embodiment, the determining, by the terminal device, a processing manner set includes: searching, by the terminal device, a mapping table based on the plurality of possible DCI formats, and determining the plurality of processing manners that are included in the descrambling manner set and that correspond to the plurality of possible DCI formats, where the mapping table is stored by the network device and the terminal device separately before the terminal device detects the PDCCH.

According to a third aspect, a network device is provided. The network device includes a processor and a memory, configured to support the network device in performing a corresponding function in the foregoing method. The processor and the memory are in communication connection. The memory stores a program. The processor is configured to invoke the program to implement the information transmission method in any of the various embodiments.

According to a fourth aspect, a network device is provided. The network device includes a processing module and a storage module, configured to support the network device in performing a function of the network device in any of the various embodiments. The function may be implemented by hardware or may be implemented by hardware executing corresponding software. The hardware or the software includes one or more modules corresponding to the foregoing function.

According to a fifth aspect, a terminal device is provided. The terminal device includes a processor and a memory, configured to support the terminal device in performing a corresponding function in the foregoing method. The processor and the memory are in communication connection. The memory stores a program. The processor is configured to invoke the program to implement the information transmission method in any of the various embodiments.

According to a sixth aspect, a terminal device is provided. The terminal device includes a processing module and a storage module, configured to support the terminal device in performing a function of the terminal device in any of the various embodiments. The function may be implemented by hardware or may be implemented by hardware executing corresponding software. The hardware or the software includes one or more modules corresponding to the foregoing function.

According to a seventh aspect, a computer readable medium is provided, configured to store a computer program. The computer program includes an instruction used to perform the method in any of the various embodiments.

According to an eighth aspect, a computer readable medium is provided, configured to store a computer program. The computer program includes an instruction used to perform the method in any of the various embodiments.

DESCRIPTION OF EMBODIMENTS

The following describes technical solutions of this application with reference to accompanying drawings.

Figure 1:
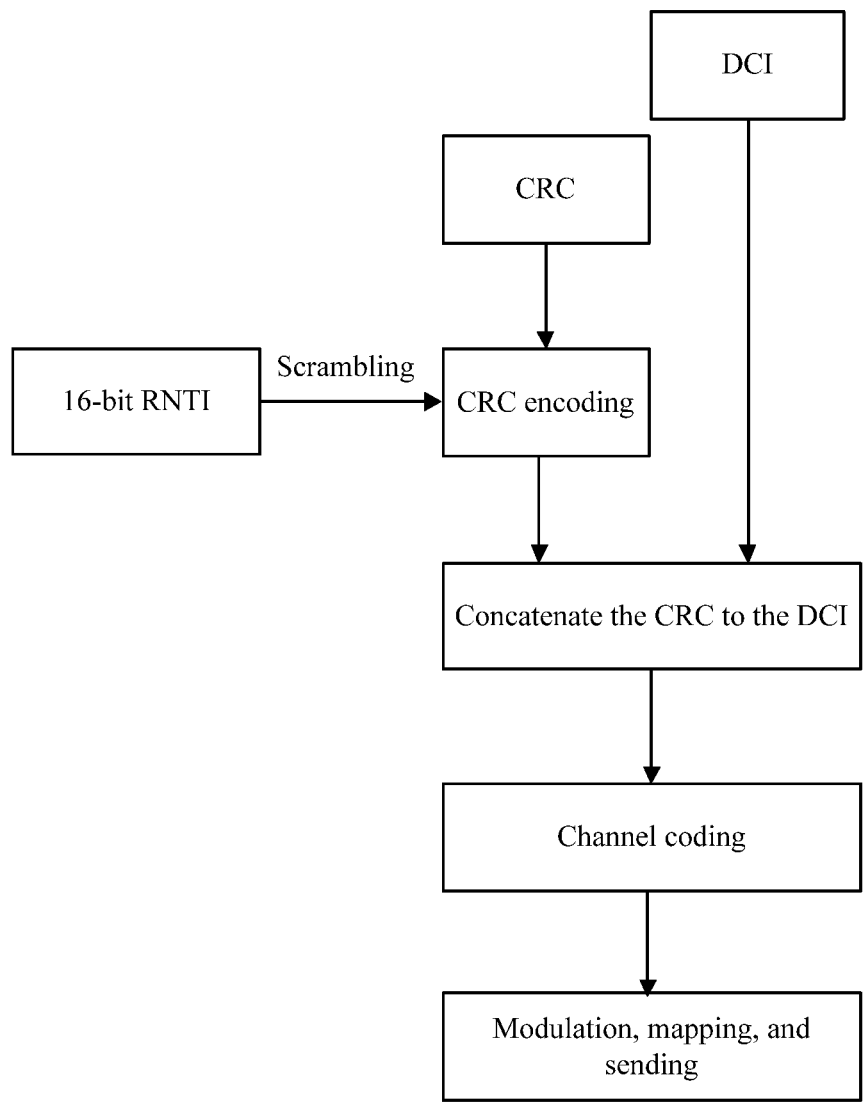
FIG. 1 is a schematic flowchart of a method for sending a PDCCH in existing LTE.

FIG. 1 is a schematic flowchart of a method for sending a PDCCH in existing LTE. It may be learned from FIG. 1 that a base station first needs to perform CRC encoding on DCI to be sent, to obtain a 16-bit CRC sequence. Then the base station performs an exclusive OR (XOR) operation (that is, a scrambling operation) on 16-bit radio network temporary identifier (RNTI) information and the 16-bit CRC sequence to obtain a 16-bit CRC sequence scrambled by an RNTI, concatenates the 16-bit CRC sequence scrambled by the RNTI to the DCI, and performs channel coding, modulation, mapping, and sending procedures. The channel coding on the PDCCH uses TBCC.

At a receive end, UE does not know in advance a format of DCI carried in a received PDCCH, and does not know a location at which required information is located either. However, the UE knows a state in which the UE lies and DCI information that the UE expects to receive in the state. For example, when in an idle state, the UE expects to receive paging system information (SI); after initiating random access, the UE expects a random access channel (RACH) response; when there is uplink data to be sent, the UE expects an uplink grant (UL Grant); when in a transmission mode 3 (TM3) mode, the UE expects DCI of a format 1A or a format 2A; and so on. The UE knows search space of the UE, and therefore knows control channel elements (CCE) on which DCI is possibly distributed. For different expected information, the UE performs CRC check by using a corresponding X-RNTI and a CCE in the search space that belongs to the UE. If the CRC check succeeds, the UE knows that information is required by the UE, and also knows a corresponding DCI format and a modulation method, to further parse content of the DCI. Before performing blind detection, the UE knows a transmission state and search space of the UE, and a corresponding RNTI. Therefore, when performing blind detection in the search space of the PDCCH, the UE needs to attempt to perform decoding in only search space for a DCI format that possibly appears, to detect whether content in the search space is content that is required by the UE, and does not need to perform matching on all DCI formats. The DCI format that possibly appears depends on information that the UE expects to receive and a transmission mode. For example, if the UE expects to receive a downlink shared channel (DL-SCH) and uses a transmission mode 1, when decoding a PDCCH scrambled by using a cell RNTI (C-RNTI), the UE may attempt to decode only a DCI format 1A and a DCI format 1. If expecting to receive an uplink grant in a subframe at the same time, the UE may attempt to perform decoding by using a DCI format 0. When blind detection is performed on a DCI format, there are 22 possible candidate locations. When decoding is performed in a transmission mode or state (such as a random access RNTI (RA-RNTI)), there are a maximum of two possible DCI formats. Therefore, a total quantity of times for which the UE performs blind detection on the PDCCH does not exceed 44.

Figure 2:
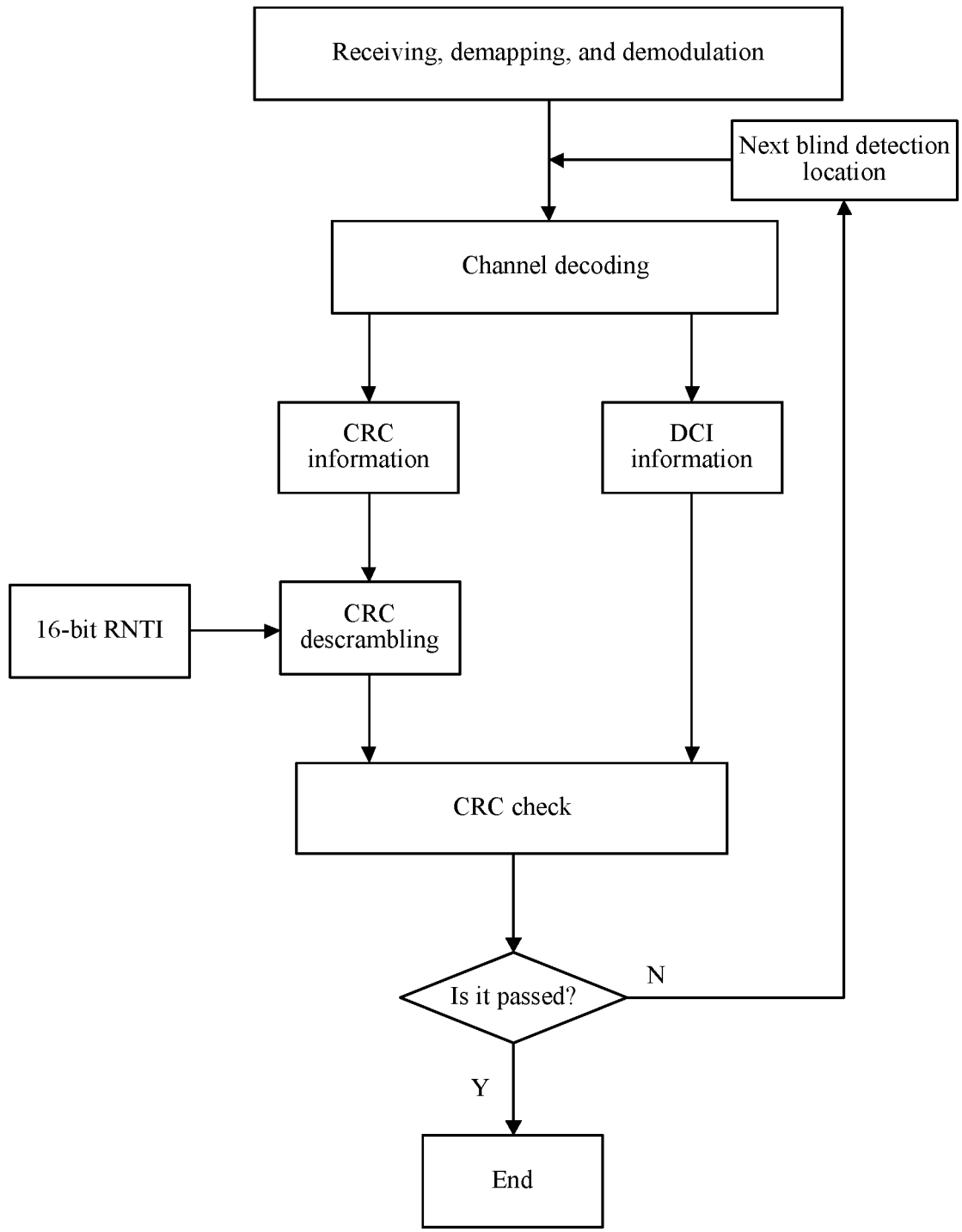
FIG. 2 is a schematic flowchart of performing blind detection on a PDCCH by a terminal in existing LTE.

FIG. 2 is a schematic flowchart of a process of performing blind detection on a PDCCH by a terminal in existing LTE. It may be learned from FIG. 2 that the terminal first needs to perform demapping, demodulation, and channel decoding procedures on a received PDCCH, and then descrambles a CRC by using an RNTI that corresponds to a format of DCI required by the terminal. After the descrambling succeeds, the terminal performs CRC check. After the check succeeds, that is, after the blind detection succeeds, the terminal determines the format of the DCI, and parses content of the DCI. If the descrambling or the check fails, the terminal performs blind detection again at a next candidate location.

A polar code belongs to a high-performance channel coding scheme proposed in recent years, features high performance, relatively low complexity, and a flexible rate matching manner, and currently has become an encoding manner for control information in a 5G system. In actual engineering, a polar code decoding manner is SCL decoding, and basic features are as follows:

1. In a decoding process, a path formed from a root node to any node corresponds to a path metric.

2. The path is extended starting from the root node at an information bit.

3. When extension is performed from each layer to a next layer, L paths having larger path metrics in a current layer are selected, where L is referred to as a search width.

4. The extension is performed until arriving at the last layer. If CRC-aided (CA) decoding is performed, a path with a smallest absolute value of metric of paths that pass CRC check is selected as a decoding result; or if parity check (PC) decoding is performed, a path with a smallest absolute value of path metric is selected as a decoding result.

In 5G, a polar code encoding scheme is used for a control channel. However, for same user equipment in a same state and a same transmission mode, there are still two possible DCI formats needing to be blindly detected. In this case, because of a nested encoding feature of the polar, the two DCI formats are possibly indistinguishable, that is, the terminal device may fail in performing blind detection. Consequently, the terminal cannot determine correct DCI, and cannot correctly process data related to a physical uplink/downlink shared channel, severely affecting a communication capability of the terminal.

Figure 3:
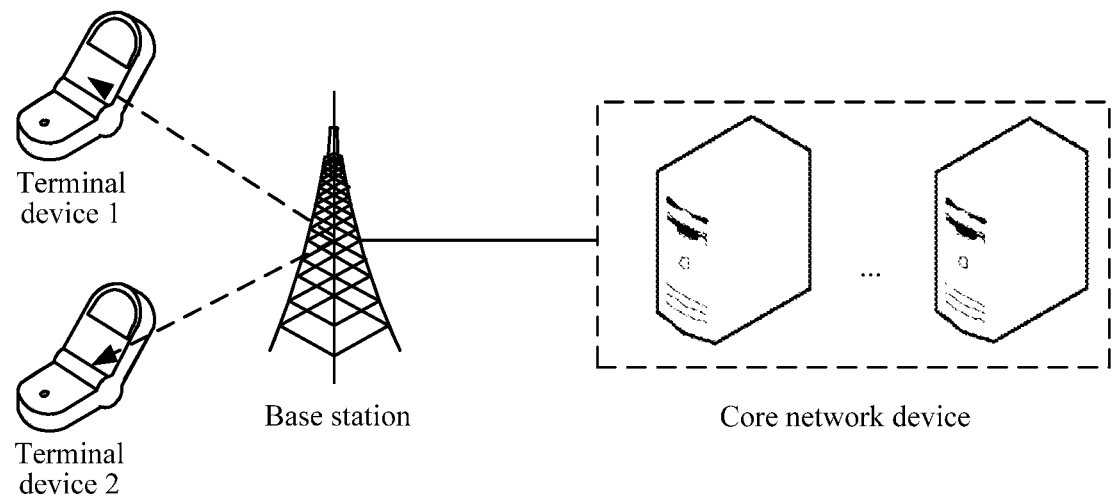
FIG. 3 is a schematic diagram of an application scenario according to an embodiment of this application.

Based on the foregoing problem that the terminal device cannot distinguish between DCI formats for the same user equipment in the same state and the same transmission mode due to use of the polar code encoding manner, this application provides an information transmission method. FIG. 3 is a schematic diagram of an application scenario according to this application. As shown in FIG. 3, this embodiment of this application may be applied to a wireless communications system. The wireless communications system usually includes cells, each cell includes one or more base stations, and the base station provides a communication service for a plurality of terminal devices, where the base station is connected to a core network device.

It should be understood that this embodiment of this application is described by using only the application scenario shown in FIG. 3 as an example. However, this embodiment of this application is not limited thereto.

It should be understood that the wireless communications system mentioned in this embodiment of this application includes but is not limited to: a narrowband internet of things system (NB-IoT), a global system for mobile communications (GSM), an enhanced data rates for GSM evolution system (EDGE), a wideband code division multiple access system (WCDMA), a Code Division Multiple Access 2000 system (CDMA2000), a time division-synchronous code division multiple access system (TD-SCDMA), LTE, and three application scenarios of a next generation 5G mobile communications system: an enhanced mobile broadband (eMBB) scenario, an ultra-reliable and low latency communications (URLLC) scenario, and a massive internet of things communications (mMTC) scenario.

In the embodiments of this application, the base station is an apparatus deployed in a radio access network to provide a wireless communication function for UE. The base station may include a macro base station, a micro base station (also referred to as a small cell), a relay station, an access point, or the like in various forms. In systems that use different radio access technologies, names of devices that have a base station function may be different. For example, in an LTE system, the device is referred to as an evolved NodeB (eNB or eNodeB), and in a 3rd generation (3G) system, the device is referred to as a NodeB. For ease of description, in all the embodiments of this application, all the foregoing apparatuses that provide a wireless communication function for the UE are referred to as a network device.

The terminal device in this embodiment of this application may include various handheld devices, in-vehicle devices, wearable devices, or computing devices that have a wireless communication function, or other processing devices connected to a wireless modem. The terminal device may also be referred to as a terminal, and may further include a subscriber unit, a cellular phone, a smartphone, a wireless data card, a personal digital assistant (PDA) computer, a tablet, a wireless modem, a handset, a laptop computer, a machine type communication (MTC) terminal, or the like. For ease of description, the devices mentioned above are collectively referred to as a terminal device in all the embodiments of this application.

Figure 4:
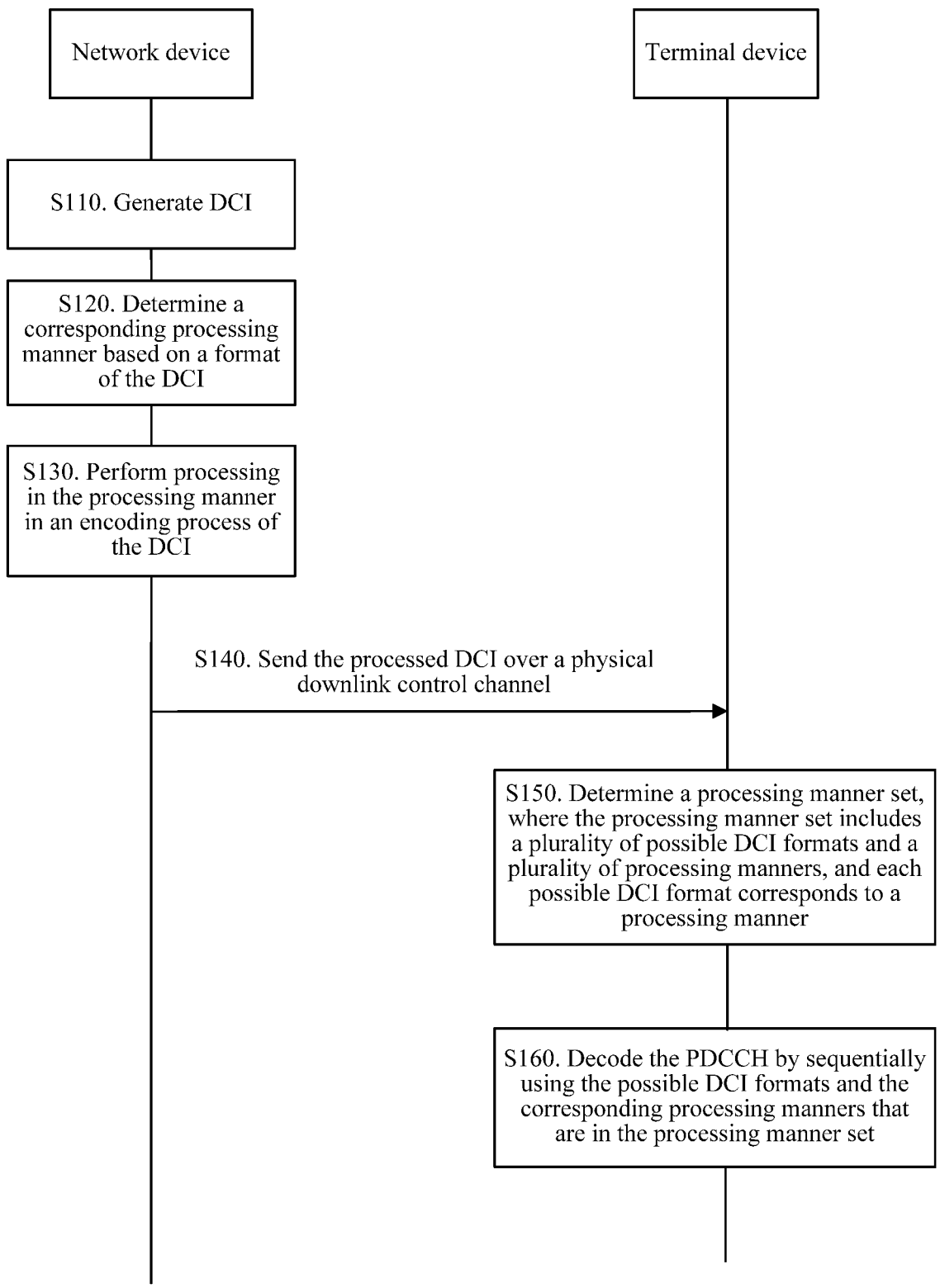
FIG. 4 is a schematic flowchart of an information transmission method according to an embodiment of this application.

FIG. 4 is a schematic flowchart of an information transmission method 100 according to an embodiment of this application. As shown in FIG. 4, the method 100 includes the following operations.

S110. A network device generates downlink control information DCI.

In one embodiment, when a terminal device needs to hand over between cells or needs to obtain scheduling information, the network device needs to send the DCI to the terminal device. The DCI includes related content such as RB allocation information and a modulation method. Therefore, the network device generates the DCI, used to notify the terminal device of data or information related to a physical uplink/downlink shared channel.

S120. The network device determines a corresponding processing manner based on a format of the DCI.

In one embodiment, different DCI carries different information content. Therefore, in a protocol, DCI is classified, and is distinguished by using different DCI formats. Currently, the following several DCI formats are defined in total: DCI0, DCI1, DCI1A, DCI1B, DCI1C, DCI1D, DCI2, DCI2A, DCI2B, DCI3, and DCI3A. The DCI0, the DCI3, and the DCI3A are DCI types related to the physical uplink shared channel or a physical uplink control channel, and the DCI1, the DCI1A, the DCI1B, the DCI1C, the DCI1D, the DCI2, the DCI2A, and the DCI2B are DCI types for the physical downlink shared channel. Different DCI formats have different lengths and modulation methods. Only after learning of a format of DCI, the terminal device can correctly parse content of the DCI.

DCI of each format corresponds to a processing manner. For example, the network device generates the DCI1. The network device processes an encoding process of the DCI1 in a corresponding processing manner based on a format of the DCI1. A correspondence among a DCI format, a processing manner of the network device, and a processing manner of the terminal device may be stipulated in advance by the network device and the terminal device, and may be a preset mapping relationship. That is, the network device processes DCI of a format in a processing manner, and when determining a corresponding processing manner, the terminal device may determine the format of the DCI based on the processing manner of the terminal device. For example, the network device and the terminal device negotiate in advance that the network device processes DCI in a first processing manner. When the terminal device can successfully decode, in a processing manner, the DCI processed by the network device in the first processing manner, the terminal device can determine that the decoding manner is a first processing manner of the terminal device that corresponds to the first processing manner of the network device. The terminal device determines the format of the DCI based on the first processing manner, thereby parsing content of the DCI.

In LTE, for a same terminal device in a same state and a same transmission mode, there may be two pieces of DCI of different formats needing to be distinguished. Because of the nested encoding feature of the polar, CRCs for the two pieces of DCI may be the same. Consequently, it is possible that the two DCI formats are indistinguishable by the terminal device. As a result, the terminal cannot determine correct DCI information. To resolve the problem, the network device may process DCI of each format in a corresponding processing manner, and the terminal device may distinguish between the two pieces of DCI of different formats by determining a processing manner of the terminal device corresponding to a processing manner of the network device because processing manners of the terminal device and DCI formats are in a one-to-one correspondence.

S130. The network device performs processing in the processing manner in an encoding process of the DCI.

S140. The network device sends the processed DCI over a PDCCH.

In one embodiment, after determining the processing manner in which the DCI is processed, in an encoding process of the DCI, the network device uses the processing manner to process a CRC, an RNTI, or the like of the DCI, and sends the processed DCI over the PDCCH to the terminal device.

Correspondingly, the terminal device detects the PDCCH sent by the network device, and the PDCCH includes the downlink control information DCI.

In one embodiment, the terminal device may detect the PDCCH at different locations, and the PDCCH carries the DCI. In one embodiment, the terminal device needs to determine the format of the DCI.

S150. The terminal device determines a processing manner set, where the processing manner set includes a plurality of possible DCI formats and a plurality of processing manners, where each possible DCI format corresponds to a processing manner.

In one embodiment, the terminal device does not know a processing manner in which the DCI is processed by the network device. Therefore, the terminal device cannot directly determine a corresponding processing manner of the terminal device. However, the terminal device knows a state in which the terminal device lies and DCI information that the terminal device expects to receive in the state. Therefore, the terminal device determines possible formats of the DCI, then separately determines processing manners that correspond to the possible DCI formats, and combines the possible processing manners into a processing manner set. Each processing manner in the processing manner set corresponds to DCI of a format. For example, if the terminal device expects to receive a DL-SCH and uses a transmission mode 1, when processing a PDCCH scrambled by using a C-RNTI, the terminal device attempts to decode only the DCI1A and the DCI1. Therefore, the terminal device uses a processing manner corresponding to the DCI1A and a processing manner corresponding to the DCI1 to form a processing manner set.

S160. The terminal device decodes the PDCCH by sequentially using the possible DCI formats and the corresponding processing manners that are in the processing manner set.

In one embodiment, the terminal device decodes the PDCCH in the possible processing manners in the processing manner set that correspond to the possible DCI formats. When determining a processing manner in which the PDCCH can be correctly decoded, the terminal device can determine, based on a DCI format corresponding to the processing manner, the format of the DCI sent by the network device. In this way, content of the DCI may be parsed.

It should be understood that a correspondence among a DCI format, a processing manner of the terminal device, and a processing manner of the network device is negotiated by the network device and the terminal device before the network device sends the DCI, in one embodiment, a mapping relationship exists. The network device knows a processing manner to which DCI of a format corresponds, and the terminal device knows DCI of a format to which a processing manner corresponds. A mapping relationship exists among a DCI format, a processing manner of the terminal device, and a processing manner of the network device. That is, the network device determines a processing manner of the network device based on a DCI format, the terminal device determines a DCI format based on a processing manner of the terminal device, and the processing manner of the terminal device corresponds to the processing manner of the network device.

It should be further understood that the processing manner set may not include the processing manner of the terminal device that corresponds to the processing manner of the network device. In one embodiment, the PDCCH cannot be correctly decoded in any processing manner in the processing manner set. For this case, the terminal device notifies the network device of the incorrect decoding, and the network device resends the PDCCH. The processing operation of the network device and the processing operation of the terminal device are repeatedly performed.

It should be further understood that for DCI of a same format, a processing manner of the terminal device corresponds to a processing manner of the network device. The network device performs processing in a processing manner in an encoding process of the DCI, and the terminal device determines a plurality of different processing manners of the terminal device by determining possible DCI formats, and finally determines a processing manner of the terminal device that corresponds to the processing manner of the network device, to determine the format of the DCI.

The information transmission method provided in this embodiment of this application can resolve a problem of a failure in blind detection on DCI caused by a nested encoding feature of a polar code. When the terminal device cannot determine the format of the DCI sent by the network device, the terminal device uses processing related to DCI formats and uses a mapping relationship between an operation or information and a DCI format, to resolve the problem of the failure in blind detection on DCI. That is, the network device performs processing in a processing manner in an encoding process of the DCI, and the terminal device separately decodes the PDCCH in processing manners that correspond to possible formats of the DCI. When a processing manner of the terminal device in which decoding can be performed correctly is determined, a type of the DCI can be determined, so that content of the DCI can be parsed.

In one embodiment, the processing manner of the network device and the processing manner set that is determined by the terminal device may be determined based on a mapping table. The mapping table is stored by the network device and the terminal device separately before the network device sends the PDCCH. Different processing manners respectively corresponding to different candidate DCI formats in the same blind detection exist in the mapping table.

Table 1 is a DCI format mapping table according to an embodiment of this application.

As shown in Table 1, a column of mapping types related to DCI formats is added to an existing DCI format configuration table. When a terminal device has two possible DCI formats in a state and a transmission mode, two mapping types may be used to distinguish between the two DCI formats. Each mapping type represents a processing manner of a network device and a processing manner of the terminal device, and the mapping type may be further information in any form. The mapping table 1 may be further compressed into a mapping rule. In existing design in LTE, each time there are two possible DCI formats, one of the DCI formats has to be the DCI1A. Therefore, the mapping rule may be compressed into that the DCI1A corresponds to a mapping type Type-B, corresponding to a processing manner of the network device and a processing manner of the terminal device, and all other DCI formats correspond to a mapping type Type-A, corresponding to another processing manner of the network device and another processing manner of the terminal device.

Before the network device sends a PDCCH, the network device may determine a processing manner of the network device by using a mapping type that is related to a DCI format and that is in the mapping table 1, and the terminal device may determine, by using a mapping type in the mapping table, a DCI format that corresponds to a processing manner of the terminal device. For example, a processing manner of the network device and a processing manner of the terminal device that correspond to the Type-B are respectively a first processing manner and a second processing manner. When sending DCI, the network device performs processing in the first processing manner that corresponds to the Type-B, and sends the processed DCI to the terminal device. The terminal device determines, based on the mapping table, that a possible format of the DCI is DCI1A or DCI1, and performs processing by separately using a second processing manner that corresponds to the mapping type Type-A and another second processing manner that corresponds to the mapping type Type-B. When correctly performing decoding in the second processing manner that corresponds to the Type-B, the terminal device determines, based on a mapping relationship between the Type-B and a DCI format, that the format of the DCI is the DCI1A.

TABLE 1

DCI format mapping table

| Transmission mode | DCI format | Mapping type related to a DCI format | Search space | Transmission scheme of a PDSCH that corresponds to a PDCCH |
|---|---|---|---|---|
| Mode 1 | DCI1A | Type-B | Public search space and specific search space that is scrambled by using a C-RNTI | Single antenna port, a port 0 |
|  | DCI1 | Type-A | Specific search space scrambled by using a C-RNTI | Single antenna port, a port 0 |
| Mode 2 | DCI1A | Type-B | Public search space and specific search space that is scrambled by using a C-RNTI | Transmit diversity |
|  | DCI1 | Type-A | Specific search space scrambled by using a C-RNTI | Transmit diversity |
| Mode 3 | DCI1A | Type-B | Public search space and specific search space that is scrambled by using a C-RNTI | Transmit diversity |
|  | DCI2A | Type-A | Specific search space scrambled by using a C-RNTI | Large delay cyclic delay diversity or a transmit diversity |
| Mode 4 | DCI1A | Type-B | Public search space and specific search space that is scrambled by using a C-RNTI | Transmit diversity |
|  | DCI2 | Type-A | Specific search space scrambled by using a C-RNTI | Closed-loop spatial multiplexing or a transmit diversity |
| Mode 5 | DCI1A | Type-B | Public search space and specific search space that is scrambled by using a C-RNTI | Transmit diversity |
|  | DCI1D | Type-A | Specific search space scrambled by using a C-RNTI | Multiuser multi-antenna |
| Mode 6 | DCI1A | Type-B | Public search space and specific search space that is scrambled by using a C-RNTI | Transmit diversity |
|  | DCI1B | Type-A | Specific search space scrambled by using a C-RNTI | Closed-loop spatial multiplexing using one transport layer |
| Mode 7 | DCI1A | Type-B | Public search space and specific search space that is scrambled by using a C-RNTI | If there is only one PBCH antenna port, a single antenna port, where a port 0 is used; otherwise, a transmit diversity. |
|  | DCI1 | Type-A | Specific search space scrambled by using a C-RNTI | Single antenna port, a port 5 |
| Mode 8 | DCI1A | Type- B | Public search space and specific search space that is scrambled by using a C-RNTI | If there is only one PBCH antenna port, a single antenna port, where a port 0 is used; otherwise, a transmit diversity. |
|  | DCI2B | Type-A | Specific search space scrambled by using a C-RNTI | Dual-layer transmission, a port 7 and a port 8; or a single antenna port, a port 7 or a port 8 |
| Mode 9 | DCI1A | Type-B | Public search space and specific search space that is scrambled by using a C-RNTI | Non-multicast/broadcast single frequency network subframe, if there is only one PBCH antenna port, a single antenna port, where a port 0 is used; otherwise, a transmit diversity; multicast/broadcast single frequency network subframe, a single antenna port, a port 7 |
|  | DCI2C | Type-A | Specific search | Up to eight layers of transmission |

TABLE 1-continued

DCI format mapping table

| Transmission mode | DCI format | Mapping type related to a DCI format | Search space | Transmission scheme of a PDSCH that corresponds to a PDCCH |
|---|---|---|---|---|
| | | | space scrambled by using a C-RNTI | ports, a port 7 to a port 14; or a single antenna port, and if a higher layer parameter is configured for the terminal device, the single antenna port is a port 7 or a port 8 |
| Mode 10 | DCI1A | Type-B | Public search space and specific search space that is scrambled by using a C-RNTI | Non-multicast/broadcast single frequency network subframe, if there is only one PBCH antenna port, a single antenna port, where a port 0 is used; otherwise, a transmit diversity; multicast/broadcast single frequency network subframe, a single antenna port, a port 7 |
| | DCI2D | Type-A | Specific search space scrambled by using a C-RNTI | Up to eight layers of transmission ports, a port 7 to a port 14; or a single antenna port, the single antenna port is a port 7, a port 8, a port 11, or a port 13, and if a higher layer parameter is configured for the terminal device, the single antenna port is a port 7 or a port 8 |

It should be understood that the mapping type may further belong to another mapping relationship. For example, the DCI1A corresponds to a mapping type Type-A, the mapping type Type-A corresponds to an operation or information in any form, and all other DCI formats correspond to a mapping type Type-B, corresponding to another operation or information in any form, provided that the terminal device can distinguish between two different DCI formats through mapping. This embodiment of this application is not limited herein.

It should be further understood that when the terminal device has a plurality of possible DCI formats in a state and a transmission mode, there may be a plurality of mapping types. For example, in future 5G, it is possible that when the terminal device has three possible DCI formats in a state and a transmission mode, three different mapping types may be used to correspond to the different DCI formats. This embodiment of this application is not limited herein.

It should be further understood that Table 1 is only an example of a mapping type, and the mapping type may be further another type. For example, the DCI1A corresponds to a mapping type Type-A, corresponding to a processing manner, and all other DCI formats correspond to a mapping type Type-B, corresponding to another piece of information or a mapping type in another form. This embodiment of this application is not limited herein.

In one embodiment, the processing manner of the network device includes:

scrambling a CRC code of the DCI by using a sequence that corresponds to a format of the DCI; and/or performing bit reordering and/or resetting that corresponds to a format of the DCI on all or a part of a CRC code of the DCI.

Figure 5:
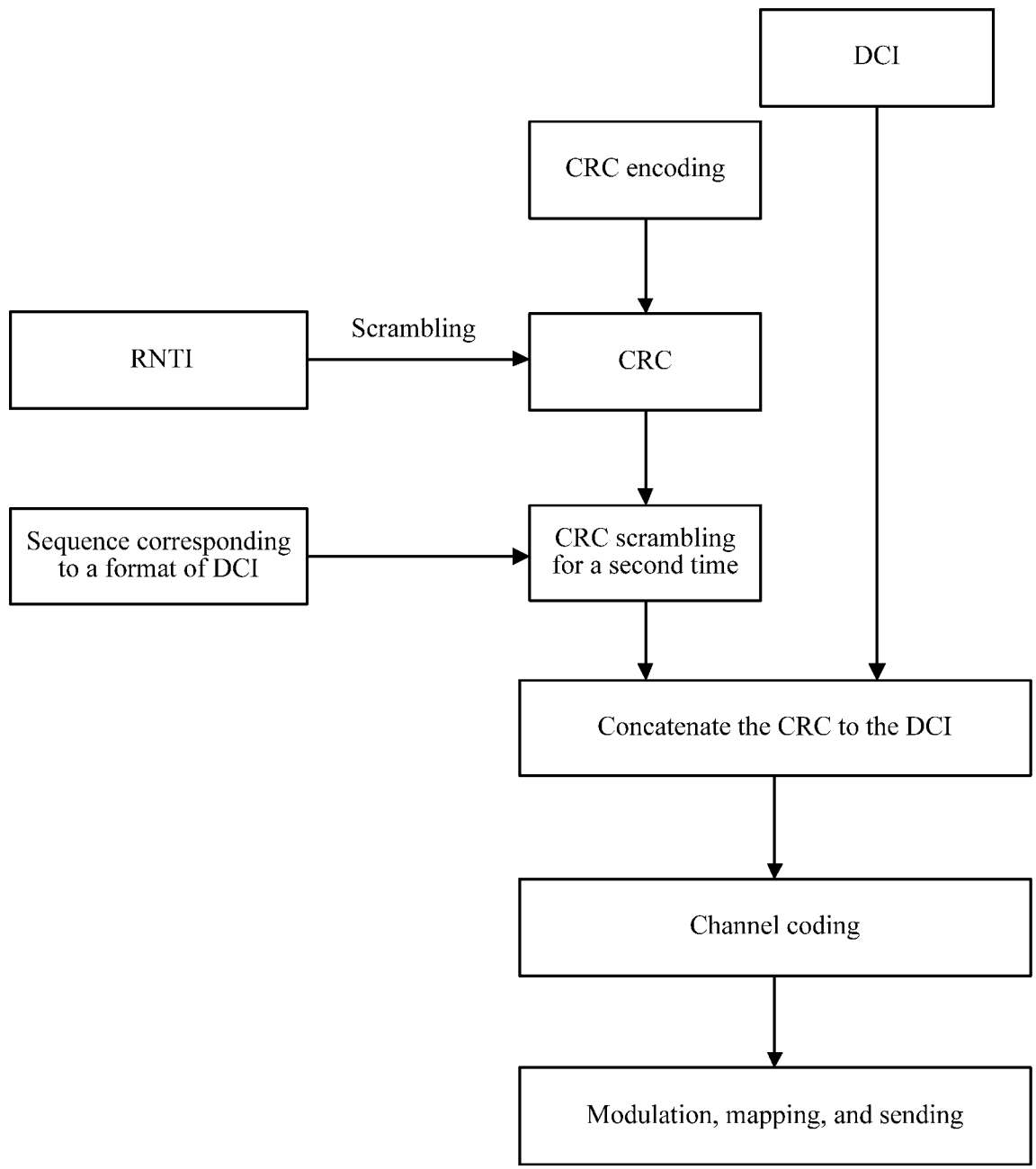
FIG. 5 is a schematic flowchart of scrambling a CRC code of DCI by a network device according to an embodiment of this application.
Figure 6:
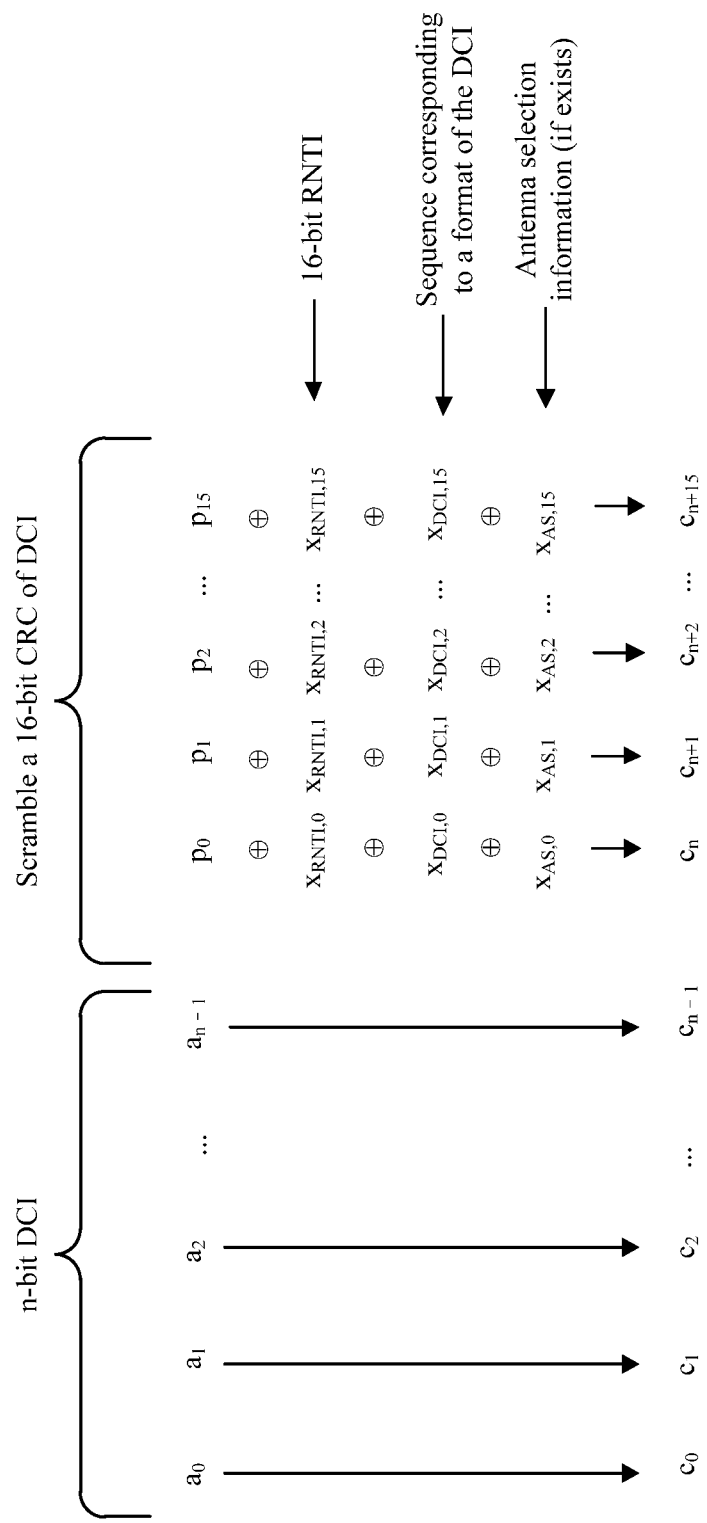
FIG. 6 is a schematic flowchart of scrambling a CRC by using a sequence that corresponds to a format of DCI according to an embodiment of this application.

In one embodiment, FIG. 5 is a schematic flowchart of scrambling a CRC code of DCI according to an embodiment of this application. As shown in FIG. 5, after the CRC is scrambled by using an RNTI, the CRC is scrambled again by using a sequence related to a format of the DCI. Alternatively, bit level processing related to the format of the DCI may be performed on all or a part of the CRC code of the DCI, and then encoding is performed by using the processed CRC and DCI. FIG. 6 is a schematic flowchart of scrambling a CRC by using a sequence that corresponds to a format of DCI according to an embodiment of this application. As shown in FIG. 6, after the CRC of the DCI is scrambled (an exclusive OR operation is performed on the CRC of the DCI) by using 16-bit RNTI information, the scrambled CRC may be scrambled again by using the sequence that corresponds to the format of the DCI, and then the scrambled CRC is used to concatenate to the DCI. If there is antenna selection information, DCI information scrambled by using the sequence that corresponds to the format of the DCI is sent over a PDCCH to a terminal device on a selected antenna port.

It should be understood that in this embodiment of this application, before the CRC is scrambled by using the RNTI, the CRC is scrambled again by using a sequence corresponding to the format of the DCI. This embodiment of this application is not limited herein.

It should be further understood that in this embodiment of this application, the network device may alternatively not perform the operation of scrambling the CRC by using the RNTI. This embodiment of this application is not limited herein.

For example, it is assumed that the format of the DCI is DCI1. The CRC may be scrambled by using a sequence related to the DCI1. The sequence may include 1 and x 0, where 1 lies in the first bit in the sequence, and x is a quantity of information bits that correspond to the DCI1. The sequence is CRC encoded, and then is processed with the CRC of the DCI1 through exclusive OR processing. Alternatively, a result sequence of sequences (which may be such a sequence as [1000 . . . ]) that correspond to various DCI formats and that are CRC encoded may be pre-stored, and then is directly processed with the CRC of the DCI1 through exclusive OR processing.

It should be understood that there may be a plurality of sequences corresponding to the DCI format, and sequences corresponding to the formats may be all different. The sequence meets a particular design requirement or application requirement. In a future 5G system, a sequence corresponding to a DCI format may be fixed or not fixed. This embodiment of this application is not limited herein.

The performing bit level processing that corresponds to the format of the DCI on all or a part of the CRC code of the DCI may be performing bit reordering that corresponds to the format of the DCI on all or a part of the CRC code of the DCI, performing bit resetting that corresponds to the format of the DCI on all or a part of the CRC code of the DCI, or a combination of the two manners. The bit reordering may be one or more of bit interleaving, reversing, and bit reversing and reordering, or reordering in another manner. The bit resetting may be a resetting operation such as negation, setting to all 1s, or setting to all 0s. This embodiment of this application is not limited herein.

For example, the negation operation may be bit negation on all or a part of the CRC code of the DCI, or in another form. This embodiment of this application is not limited herein.

It should be understood that the sequence related to the format of the DCI may be further another sequence, and the sequence corresponds to the format of the DCI. Sequences corresponding to different DCI formats are different. The sequence may be a pre-stored random sequence, or may be a random sequence generated online by using a random number seed of a corresponding DCI format in the mapping table. This embodiment of this application is not limited herein.

It should be further understood that a processing manner used by the network device for a DCI format may be obtained through a mapping type Type-A in Table 1. Correspondingly, another different processing manner used for another DCI format is obtained through a mapping type Type-B in Table 1. No processing may be performed in the Type-B. This embodiment of this application is not limited herein.

It should be further understood that in this embodiment of this application, mapping types vary with different DCI formats. For example, for two DCI formats, two mapping types respectively correspond to different processing manners. For a plurality of DCI formats, it is only required that mapping types corresponding to the DCI formats are different. That is, processing manners corresponding to the DCI formats are different. For example, for the foregoing Type-B, processing performed on the CRC of the DCI1A may be further performed in another manner. This embodiment of this application is not limited herein.

It should be further understood that in this embodiment of this application, processing performed on the CRC code of the DCI by using the sequence that corresponds to the format of the DCI may be further performed in another manner, and may include but is not limited to scrambling; and bit level processing that corresponds to the format of the DCI on all or a part of the CRC code of the DCI may be further bit level processing in another manner, and may include but is not limited to bit reordering and resetting. This embodiment of this application is not limited herein.

Correspondingly, the processing manner of the terminal device includes:

descrambling a CRC code of the DCI by using a sequence related to a format of the DCI that corresponds to the processing manner; and/or performing bit de-reordering and/or de-resetting that corresponds to a format of the DCI that corresponds to the processing manner on all or a part of a CRC code of the DCI.

Figure 7:
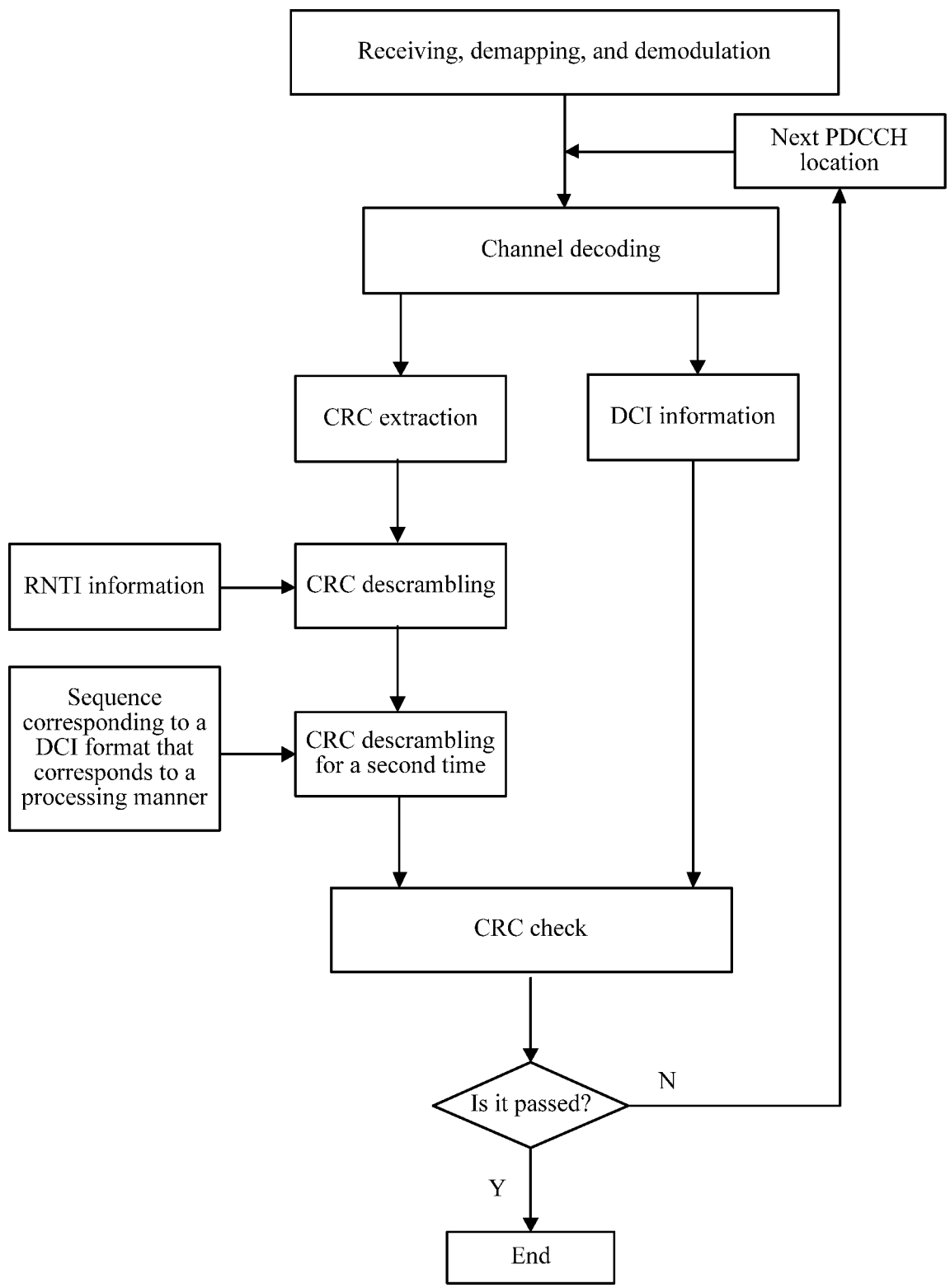
FIG. 7 is a schematic flowchart of descrambling a CRC code of DCI by a terminal device according to an embodiment of this application.

In one embodiment, FIG. 7 is a schematic flowchart of descrambling a CRC code of DCI by a terminal device according to an embodiment of this application. As shown in FIG. 7, after descrambling the CRC scrambled by using an RNTI, the terminal device may further perform descrambling for a second time on the CRC code by using a sequence that corresponds to a format of the DCI that corresponds to the processing manner of the terminal device, and then perform CRC check. Alternatively, the terminal device may perform bit de-reordering and/or de-resetting that corresponds to the format of the DCI that corresponds to the processing manner on all or a part of the CRC code of the DCI, and then may perform an operation such as CRC check, to determine whether decoding can succeed.

It should be understood that the sequence that corresponds to the format of the DCI that corresponds to the processing manner of the terminal device may include 1 and x 0, where 1 lies in the first bit in the sequence, and x is a quantity of information bits that correspond to the DCI corresponding to the processing manner of the terminal device. The sequence is CRC encoded, and then is processed with the CRC of the DCI that corresponds to the processing manner of the terminal device through exclusive OR processing. Alternatively, a result sequence of sequences (which may be such a sequence as [1000 . . . ]) that correspond to various DCI formats that correspond to processing manners of the terminal device and that are CRC encoded may be pre-stored, and then is directly processed with the CRC of the DCI that corresponds to the processing manner of the terminal device through exclusive OR processing.

The performing bit de-reordering and/or de-resetting that corresponds to a format of the DCI that corresponds to the processing manner on all or a part of a CRC code of the DCI may be performing bit de-reordering on all or a part of the CRC code, performing bit de-resetting on all or a part of the CRC code, or a combination of the two processing manners. The bit de-reordering may be bit de-interleaving, bit de-reversing, bit de-reversing and reordering, or the like, or bit de-reordering in another manner. The bit de-resetting may be a de-resetting operation such as de-negation. For example, the bit resetting may be a resetting operation such as negation, setting to all 1s, or setting to all 0s. This embodiment of this application is not limited herein.

It should be further understood that in this embodiment of this application, the terminal device may alternatively not perform the operation of descrambling the CRC by using the RNTI. This embodiment of this application is not limited herein.

It should be further understood that the sequence corresponding to the DCI format corresponding to the processing manner of the terminal device may be another sequence corresponding to the DCI format. This embodiment of this application is not limited herein.

It should be further understood that for the sequence corresponding to the format of the DCI corresponding to the processing manner of the terminal device, the sequence corresponds to the format of the DCI. Sequences corresponding to different DCI formats are different. The sequence may be a pre-stored random sequence, or may be a random sequence generated online by using a random number seed of a corresponding DCI format in a mapping table. This embodiment of this application is not limited herein.

It should be understood that there may be a plurality of sequences corresponding to the DCI format corresponding to the processing manner of the terminal device, and sequences corresponding to the formats may be all different. The sequence meets a particular design requirement or application requirement. In a future 5G system, a sequence corresponding to a DCI format may be fixed or not fixed. This embodiment of this application is not limited herein.

It should be further understood that the DCI format corresponding to the processing manner of the terminal device may be obtained in a mapping table. A processing manner used by a network device to process a DCI format may also be obtained in the mapping table. The terminal device can determine the DCI format only when the processing manner of the terminal device corresponds to the processing manner of the network device.

It should be further understood that the processing manner of the terminal device may be further another processing manner. This embodiment of this application is not limited herein.

In one embodiment, the processing manner of the network device includes:

scrambling a RNTI of the DCI by using a sequence that corresponds to a format of the DCI; and/or performing bit reordering and/or resetting that corresponds to the format of the DCI on all or a part of a RNTI, and scrambling a CRC code of the DCI by using the processed RNTI.

Figure 8:
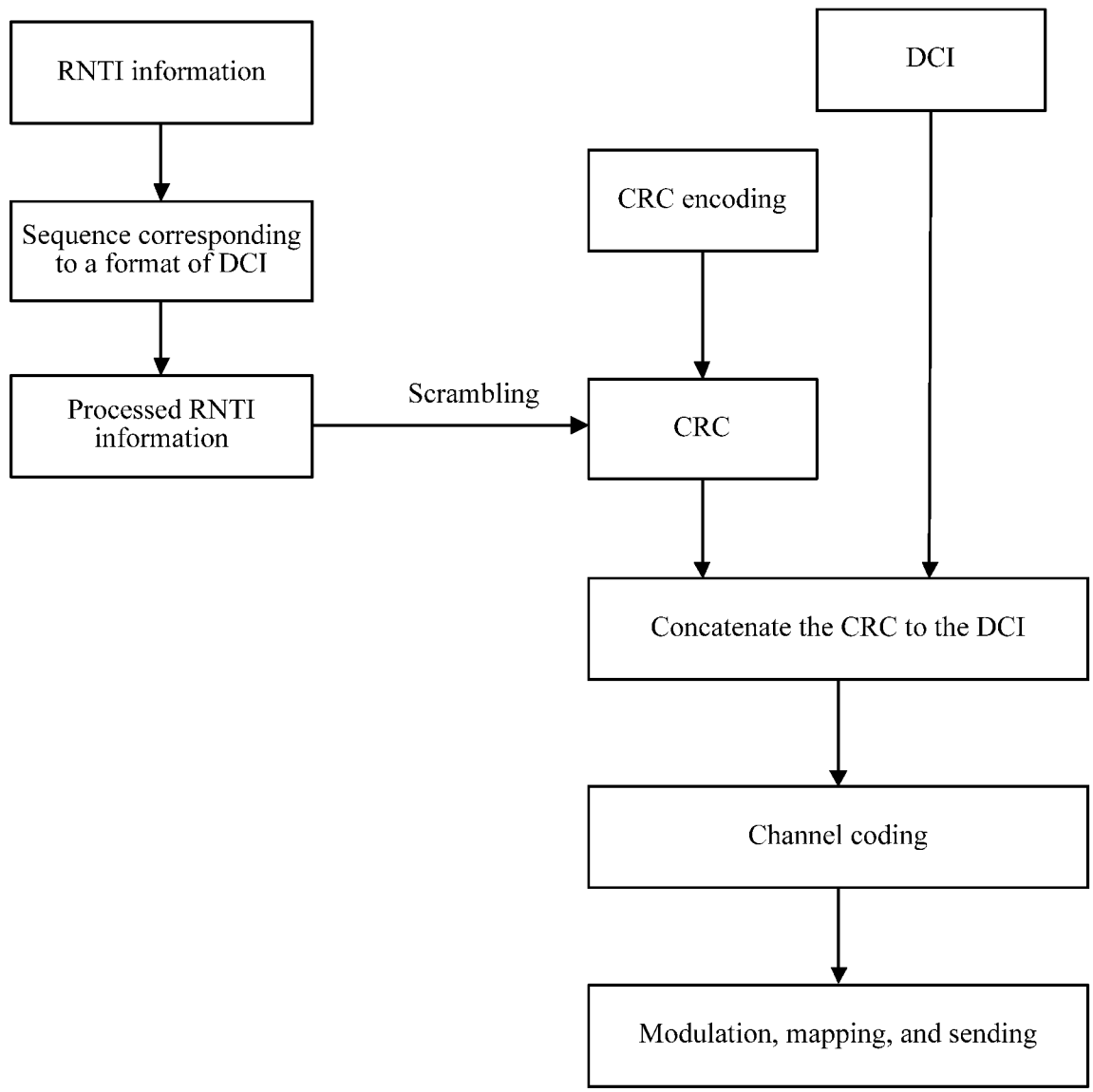
FIG. 8 is a schematic flowchart of scrambling an RNTI of a CRC code by a network device according to an embodiment of this application.

In one embodiment, FIG. 8 is a schematic flowchart of scrambling an RNTI of a CRC code by a network device according to an embodiment of this application, as shown in FIG. 8. In a scrambling process, the CRC of the DCI is scrambled by using the RNTI. Therefore, before the CRC is scrambled by using the RNTI, the RNTI may be scrambled by using a sequence related to a format of the DCI, and then the CRC is scrambled by using the processed RNTI. Alternatively, bit reordering and/or resetting that corresponds to the format of the DCI may be performed on all or a part of the RNTI, and a cyclic redundancy check CRC code of the DCI is scrambled by using the processed RNTI. Alternatively, any combination of the foregoing several processing manners is used. This embodiment of this application is not limited herein.

Bit reordering and/or resetting that corresponds to the format of the DCI is performed on all or a part of the RNTI. The bit reordering may be bit reversing and reordering, interleaving, reversing, or the like, or reordering in another manner. The bit resetting may be a resetting operation such as negation, setting to all 1s, or setting to all 0s, or resetting in another manner. This embodiment of this application is not limited herein.

For example, the negation operation may be bit negation on all or a part of the RNTI, or bit level processing in another form. This embodiment of this application is not limited herein.

It should be understood that the sequence corresponding to the format of the DCI may be another sequence corresponding to the format of the DCI. This embodiment of this application is not limited herein.

It should be further understood that there may be a plurality of sequences corresponding to the DCI format, and sequences corresponding to the formats may be all different. The sequence meets a particular design requirement or application requirement. In a future 5G system, a sequence corresponding to a DCI format may be fixed or not fixed. This embodiment of this application is not limited herein.

For example, it is assumed that the format of the DCI is DCI1. The RNTI may be scrambled by using a sequence related to the DCI1. The sequence may include 1 and x 0, where 1 lies in the first bit in the sequence, and x is a quantity of information bits that correspond to the DCI1. The sequence is CRC encoded, and then is processed with the CRC of the DCI1 through exclusive OR processing. Alternatively, a result of sequences (such as [1000 . . . ]) that correspond to various DCI formats and that are CRC encoded is pre-stored, and then is directly processed with the RNTI through exclusive OR processing.

It should be understood that for the sequence corresponding to the format of the DCI, the sequence corresponds to the format of the DCI. Sequences corresponding to different DCI formats are different. The sequence may be a pre-stored random sequence, or may be a random sequence generated online by using a random number seed of a corresponding DCI format in the mapping table. This embodiment of this application is not limited herein.

It should be understood that a manner of scrambling the RNTI and a manner of scrambling the CRC may be the same or different. For DCI of a same format, a sequence that corresponds to a format of DCI and that is used when the RNTI is scrambled and a sequence used when the CRC is scrambled may be the same or different, and a manner of performing bit reordering and/or resetting that corresponds to the format of the DCI on all or a part of the RNTI and a manner of performing bit reordering and/or resetting that corresponds to the format of the DCI on all or a part of the CRC code may be the same or different. This embodiment of this application is not limited herein.

Correspondingly, the processing manner of the terminal device includes:

descrambling a RNTI of the DCI by using a sequence that corresponds to a format of the DCI that corresponds to the processing manner; and/or performing bit de-reordering and/or de-resetting that corresponds to a format of the DCI that corresponds to the processing manner on all or a part of a RNTI of the DCI, and descrambling a CRC code of the DCI by using the processed RNTI.

Figure 9:
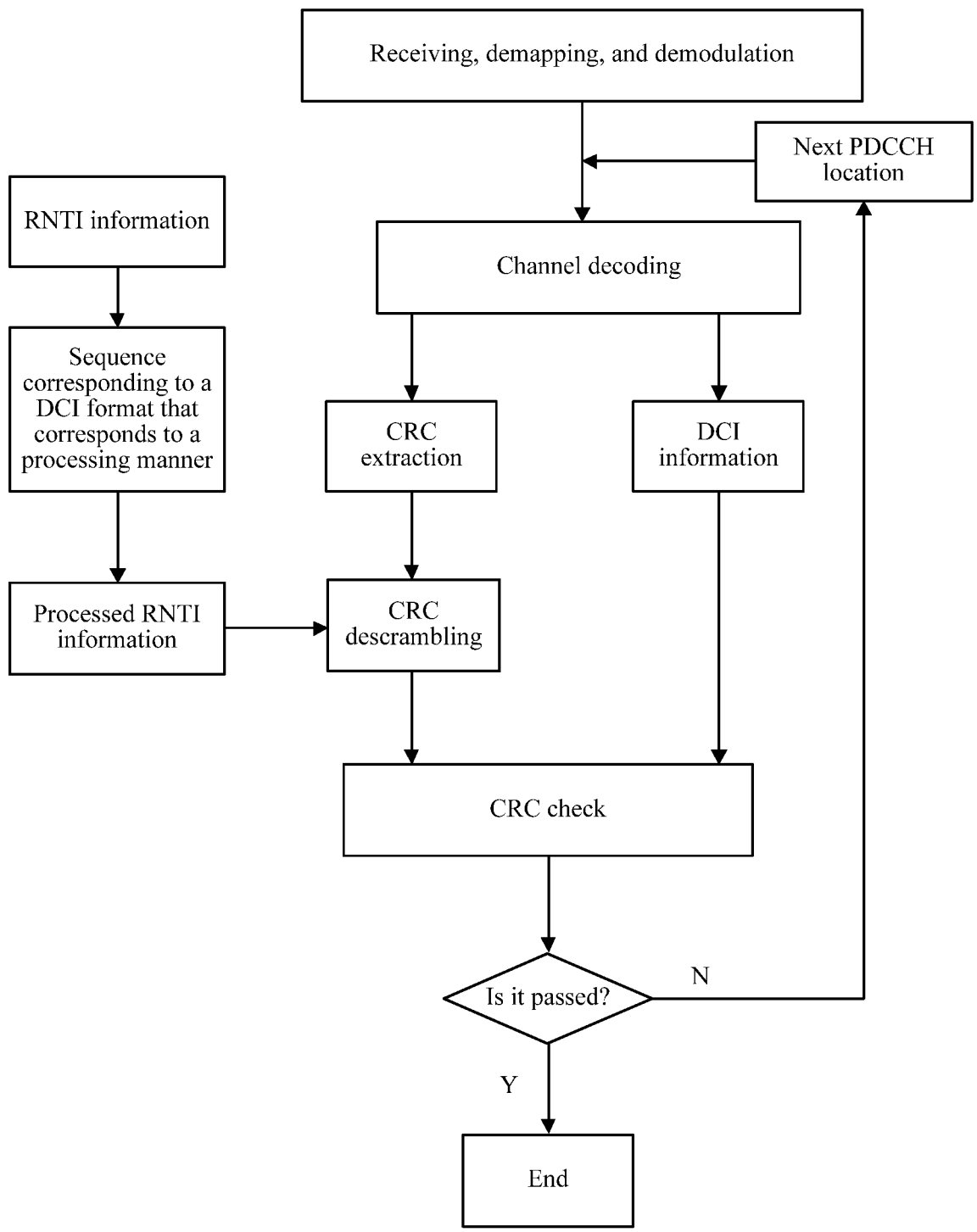
FIG. 9 is a schematic flowchart of descrambling an RNTI of a CRC code by a terminal device according to an embodiment of this application.

In one embodiment, FIG. 9 is a schematic flowchart of descrambling an RNTI of a CRC by a terminal device according to an embodiment of this application, as shown in FIG. 9. The terminal device first descrambles the RNTI by using a sequence related to a format of DCI corresponding to a processing manner, and then processes the CRC by using the descrambled RNTI. Alternatively, bit de-reordering and/or de-resetting that corresponds to the format of the DCI that corresponds to the processing manner may be performed on all or a part of the RNTI, and then the CRC is processed by using the processed RNTI. The bit reordering may be bit reversing and reordering, interleaving, reversing, or the like, or reordering in another manner. The bit resetting may be a resetting operation such as negation, setting to all 1s, or setting to all 0s, or may be any combination of the foregoing several manners. This embodiment of this application is not limited herein.

It should be understood that for the sequence corresponding to the format of the DCI corresponding to the processing manner of the terminal device, the sequence corresponds to the format of the DCI. Sequences corresponding to different DCI formats are different. The sequence may be a pre-stored random sequence, or may be a random sequence generated online by using a random number seed of a corresponding DCI format in the mapping table. This embodiment of this application is not limited herein.

It should be further understood that there may be a plurality of sequences corresponding to the DCI format corresponding to the processing manner of the terminal device, and sequences corresponding to the formats may be all different. The sequence meets a particular design requirement or application requirement. In a future 5G system, a sequence corresponding to a DCI format may be fixed or not fixed. This embodiment of this application is not limited herein.

It should be further understood that the DCI format corresponding to the processing manner of the terminal device may be obtained in a mapping table. A processing manner used by a network device to process a DCI format may also be obtained in the mapping table. The terminal device can determine the DCI format only when the processing manner of the terminal device corresponds to the processing manner of the network device.

It should be further understood that for DCI of a same format, a sequence that corresponds to the DCI format corresponding to the processing manner and that is used by the terminal device to descramble the RNTI and a sequence used by the terminal device to descramble the CRC may be the same or different, and the processing manner and a processing manner used when the CRC is descrambled may be the same or different. Bit level descrambling that is related to the DCI format corresponding to the processing manner and that is performed on all or a part of the RNTI may alternatively be bit de-reordering performed on all or a part of the RNTI, or may be bit de-resetting performed on all or a part of the RNTI, or processing in another manner. A manner of performing bit de-reordering and/or de-resetting that corresponds to the DCI format on all or a part of the RNTI and a manner of performing bit de-reordering and/or de-resetting that corresponds to the DCI format on all or a part of the CRC code may be the same or different. This embodiment of this application is not limited herein.

In one embodiment, the processing manner of the network device includes:

scrambling, by using the sequence that corresponds to the format of the DCI, all or some of frozen bits used in polar code encoding on the DCI; and/or performing bit reordering and/or resetting that corresponds to the format of the DCI on all or some of frozen bits used in polar code encoding on the DCI.

Figure 10:
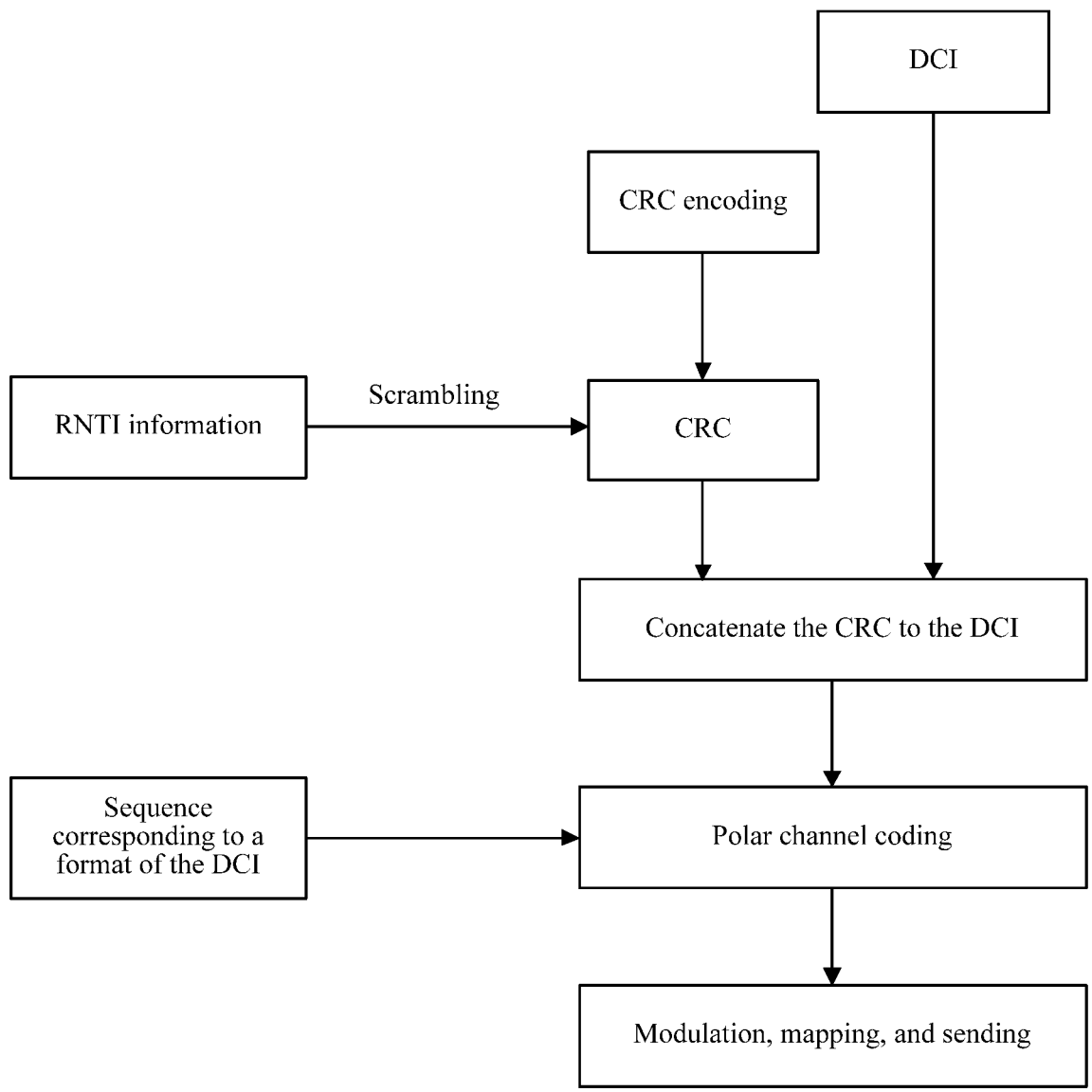
FIG. 10 is a schematic flowchart of scrambling frozen bits used in polar code encoding on DCI by a network device according to an embodiment of this application.

In one embodiment, in a polar code encoding process, frozen bits used in polar code encoding may be used to carry information. Therefore, the all or some of frozen bits used in polar code encoding on the DCI may be scrambled by using the sequence that corresponds to the format of the DCI, and/or bit reordering and/or resetting related to the format of the DCI may be performed on all or some of frozen bits used in polar code encoding on the DCI. FIG. 10 is a schematic flowchart of scrambling frozen bits used in polar code encoding on DCI by a network device according to an embodiment of this application, as shown in FIG. 10. In a polar code encoding process of the DCI, all or some of frozen bits used in polar code encoding are scrambled by using a sequence that corresponds to a format of the DCI, and/or bit reordering and/or resetting related to the format of the DCI is performed on all or some of frozen bits used in polar code encoding. The bit reordering may be bit reversing and reordering, interleaving, reversing, or the like, or reordering in another manner. The bit resetting may be a resetting operation such as negation, setting to all 1s, or setting to all 0s, or may be any combination of the foregoing several manners. This embodiment of this application is not limited herein.

For example, the negation operation may be bit negation on all or some of frozen bits used in polar code encoding, or in another form. This embodiment of this application is not limited herein.

It should be understood that the sequence corresponding to the format of the DCI may be another sequence corresponding to the format of the DCI. This embodiment of this application is not limited herein.

It should be further understood that there may be a plurality of sequences corresponding to the DCI format, and sequences corresponding to the formats may be all different. The sequence meets a particular design requirement or application requirement. In a future 5G system, a sequence corresponding to a DCI format may be fixed or not fixed. This embodiment of this application is not limited herein.

It should be further understood that for the sequence corresponding to the format of the DCI, the sequence may be a pre-stored random sequence, or may be a random sequence generated online by using a random number seed of a corresponding DCI format in the mapping table. This embodiment of this application is not limited herein.

For example, it is assumed that the format of the DCI is DCI1. A sequence related to the DCI1 may be used to scramble frozen bits used in polar encoding. The sequence may include 1 and x 0, where 1 lies in the first bit in the sequence, and x is a quantity of information bits that correspond to the DCI1. The sequence is CRC encoded, and then is processed with the CRC of the DCI1 through exclusive OR processing. Alternatively, a result of sequences (such as [1000 . . . ]) that correspond to various DCI formats and that are CRC encoded is pre-stored, and then is directly processed with the frozen bits used in the polar encoding through exclusive OR processing.

It should be further understood that the sequence that is related to the format of the DCI and that is used to scramble all or some of frozen bits used in the polar code encoding and the sequence used to scramble the CRC or the RNTI may be the same or different, and scrambling manners may be the same or different. This embodiment of this application is not limited herein.

It should be further understood that in this embodiment of this application, the network device may alternatively not perform the operation of scrambling the CRC by using the RNTI. This embodiment of this application is not limited herein.

It should be further understood that the frozen bits used in the polar code encoding may include PC frozen bits used in PC-polar encoding, CA frozen bits used in CA-polar encoding, and frozen bits used in conventional polar encoding. This embodiment of this application is not limited herein.

Correspondingly, the processing manner of the terminal device includes:

descrambling, by using a sequence that corresponds to the format of the DCI that corresponds to the processing manner, all or some of frozen bits used in polar code decoding on the PDCCH; and/or performing bit de-reordering and/or de-resetting that corresponds to the format of the DCI that corresponds to the processing manner on all or some of frozen bits used in polar code decoding on the PDCCH.

Figure 11:
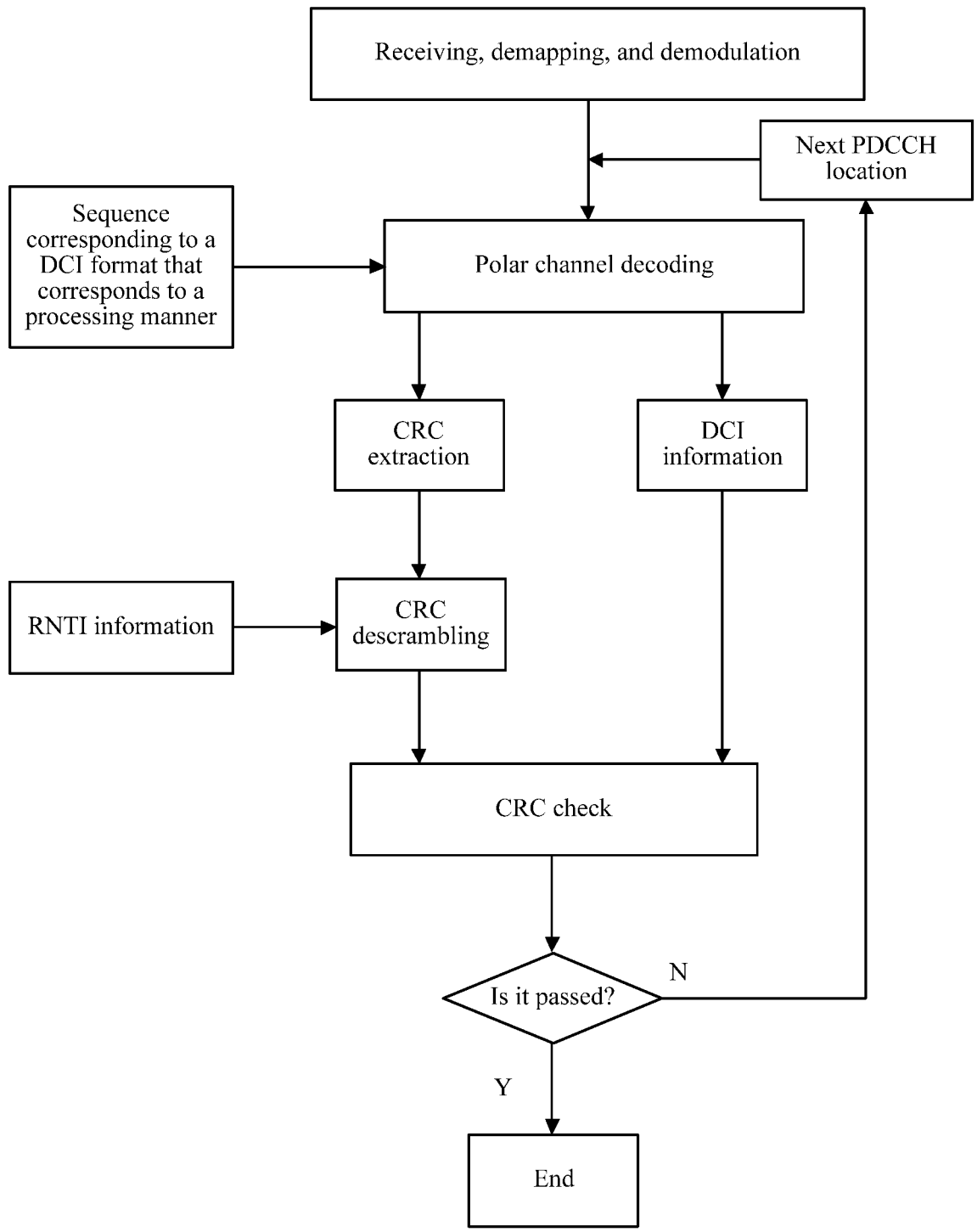
FIG. 11 is a schematic flowchart of descrambling frozen bits used in a polar code on DCI by a terminal device according to an embodiment of this application.

In one embodiment, FIG. 11 is a schematic flowchart of descrambling frozen bits used in a polar code of DCI by a terminal device according to an embodiment of this application. As shown in FIG. 11, in a polar code decoding process of a PDCCH, the terminal device descrambles, by using a sequence that corresponds to a format of the DCI that corresponds to a processing manner, frozen bits used in polar code decoding on the PDCCH, and then performs CRC check or another operation. Alternatively, the terminal device may perform bit de-reordering and/or de-resetting that corresponds to the format of the DCI that corresponds to the processing manner on all or some of frozen bits used in polar code decoding on the PDCCH.

It should be understood that for DCI of a same format, a manner of descrambling all or some of frozen bits used in the polar code decoding on the PDCCH and a processing manner of descrambling a CRC or an RNTI may be the same or different, a sequence related to the DCI format corresponding to the processing manner and a sequence that is used to descramble a CRC may be the same or different, and descrambling manners may be the same or different. For the reordering and/or resetting that is related to the DCI format corresponding to the processing manner and that is performed on the all or some of frozen bits used in polar code decoding on the PDCCH, the bit reordering may be one or more of bit interleaving, reversing, and bit reversing and reordering, or may be reordering in another manner. The bit resetting may be a resetting operation such as negation, setting to all 1s, or setting to all 0s. A manner of performing de-reordering and/or de-resetting on all or some of frozen bits used in the polar code and a manner of performing de-reordering and/or de-resetting on the CRC code or the RNTI may be the same or different. This embodiment of this application is not limited herein.

It should be further understood that in this embodiment of this application, the terminal device may alternatively not perform the operation of descrambling the CRC by using the RNTI. This embodiment of this application is not limited herein.

It should be further understood that for the sequence corresponding to the format of the DCI corresponding to the processing manner of the terminal device, the sequence corresponds to the format of the DCI. Sequences corresponding to different DCI formats are different. The sequence may be a pre-stored random sequence, or may be a random sequence generated online by using a random number seed of a corresponding DCI format in a mapping table. This embodiment of this application is not limited herein.

It should be further understood that in this embodiment of this application, the foregoing several processing manners of the network device may be used separately or may be used as a combination of any several of the processing manners. This embodiment of this application is not limited herein.

It should be further understood that in this embodiment of this application, the foregoing several processing manners of the terminal device may be used separately or may be used as a combination of any several of the processing manners. This embodiment of this application is not limited herein.

It should be further understood that sequence numbers of the foregoing processes do not mean execution sequences in the embodiments of this application. The execution sequences of the processes should be determined based on functions and internal logic of the processes, and should not be construed as any limitation on the implementation processes of the embodiments of this application.

The information transmission method provided in the embodiments of this application can resolve a problem of a failure in blind detection on DCI caused by a nested encoding feature of a polar code. When the terminal device cannot determine the format of the DCI sent by the network device, the network device may use a mapping relationship, and use processing manners related to DCI formats, to resolve the problem of the failure in blind detection on DCI. That is, the network device processes DCI of a format in a processing manner. The processing manners and the DCI formats are in a one-to-one correspondence, and have a mapping relationship. After a processing manner of the terminal device corresponds to the processing manner of the network device, a type of the DCI can be determined. That is, blind detection may succeed.

The foregoing describes in detail the information transmission method according to the embodiments of this application with reference to FIG. 1 to FIG. 11. The following describes in detail a network device and a terminal device according to the embodiments of this application with reference to FIG. 11 to FIG. 15.

Figure 12:
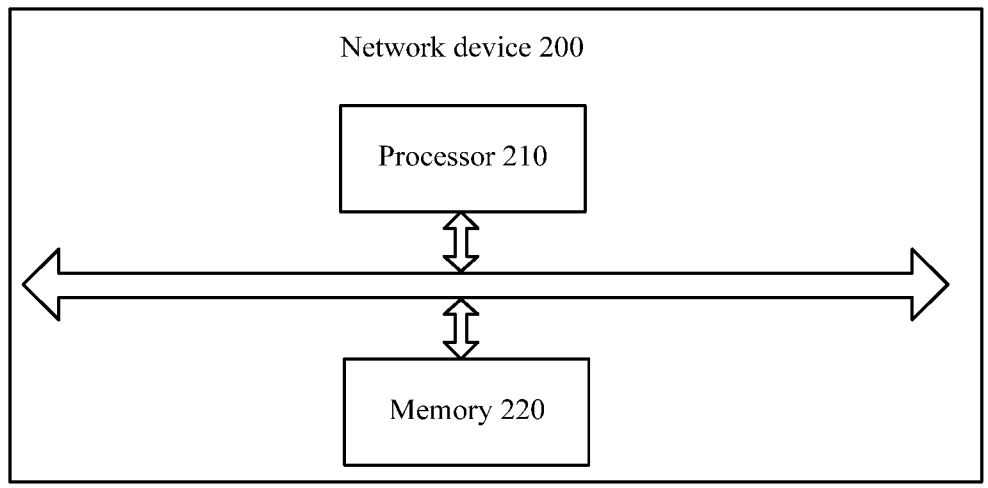
FIG. 12 is a schematic block diagram of a network device according to an embodiment of this application.

FIG. 12 is a schematic block diagram of a network device according to an embodiment of this application. It should be understood that the network device embodiment mutually corresponds to the method embodiment, and for similar descriptions, refer to the method embodiment. A server 200 shown in FIG. 12 corresponds to the network device in the method embodiment in a figure. The network device 200 includes: a processor 210 and a memory 220 that stores a program to be executed by the processor 210.

The processor 210 is configured to:
generate downlink control information DCI;
determine a corresponding processing manner based on a format of the DCI;
perform processing in the processing manner in an encoding process of the DCI; and
send the processed DCI over a PDCCH.

The network device provided in this embodiment of this application can resolve a problem of a failure in blind detection on DCI caused by a nested encoding feature of a polar code. When a terminal device cannot determine the format of the DCI sent by the network device, the network device may use a mapping relationship, and use processing manners related to DCI formats, to resolve the problem of the failure in blind detection on DCI. That is, the network device processes DCI of a format in a processing manner. After a processing manner of the terminal device corresponds to the processing manner of the network device, a type of the DCI can be determined. That is, blind detection may succeed.

Components in the network device 200 are in communication connection. That is, the processor 210 communicates with the memory 220 by using an internal connection path, to transfer a control and/or data signal. It should be noted that the foregoing method embodiments of this application may be applied to a processor, or implemented by a processor. The processor may be an integrated circuit chip and has a signal processing capability. In one process, operations in the foregoing method embodiments can be implemented by using a hardware integrated logical circuit in the processor, or by using instructions in a form of software. The processor may be a central processing unit (CPU), a network processor (NP), a combination of a CPU and an NP, a digital signal processor (DSP), an application-specific integrated circuit (ASIC), a field programmable gate array (FPGA), another programmable logic device, a discrete gate, a transistor logic device, or a discrete hardware component. It may implement or perform the methods, the steps, the operations, and logical block diagrams that are disclosed in the embodiments of this application. The general purpose processor may be a microprocessor, or the processor may be any conventional processor or the like. Operations of the methods disclosed with reference to the embodiments of this application may be directly executed and accomplished by using a hardware decoding processor, or may be executed and accomplished by using a combination of hardware and software modules in the decoding processor. The software module may be located in a mature storage medium in the art, such as a random access memory, a flash memory, a read-only memory, a programmable read-only memory, an electrically erasable programmable memory, or a register. The storage medium is located in a memory, and the processor reads information in the memory and completes the operations in the foregoing methods in combination with hardware of the processor.

In one embodiment, the processor 210 is configured to:
scramble a CRC code of the DCI by using a sequence that corresponds to the format of the DCI; and/or
perform bit reordering and/or resetting that corresponds to the format of the DCI on all or a part of a CRC code of the DCI.

In one embodiment, the processor 210 is configured to:
scramble a RNTI of the DCI by using a sequence that corresponds to the format of the DCI; and/or
perform bit reordering and/or resetting that corresponds to the format of the DCI on all or a part of a RNTI, and scramble a cyclic redundancy check CRC code of the DCI by using the processed RNTI.

In one embodiment, the processor 210 is configured to:
scramble, by using a sequence that corresponds to the format of the DCI, all or some of frozen bits used in polar code encoding on the DCI; and/or
perform bit reordering and/or resetting that corresponds to the format of the DCI on all or some of frozen bits used in polar code encoding on the DCI.

In one embodiment, the processor 210 is configured to:
search a mapping table based on the format of the DCI, and determine the corresponding processing manner, where the mapping table is stored by the network device and the terminal device separately before the network device sends the PDCCH.

Figure 13:
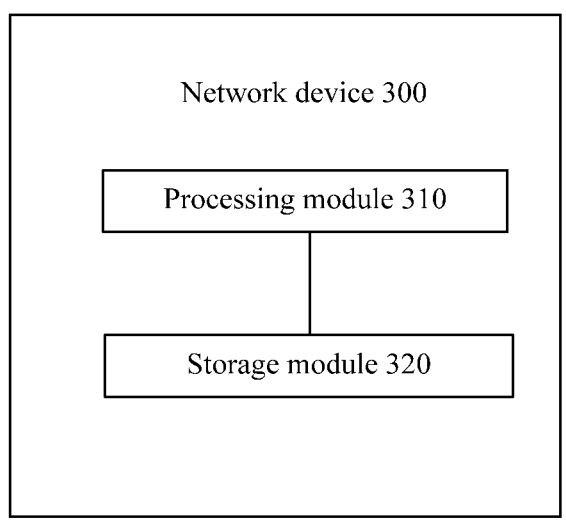
FIG. 13 is a schematic block diagram of a network device according to another embodiment of this application.

It should be noted that in this embodiment of this application, the processor 210 may be implemented by a processing module, and the memory 220 may be implemented by a storage module. As shown in FIG. 13, a network device 300 may include a processing module 310 and a storage module 320.

The network device 200 shown in FIG. 12 or the network device 300 shown in FIG. 13 can implement the processes implemented in the foregoing embodiments in FIG. 4, FIG. 5, FIG. 8, and FIG. 10. To avoid repetition, details are not described herein again.

Figure 14:
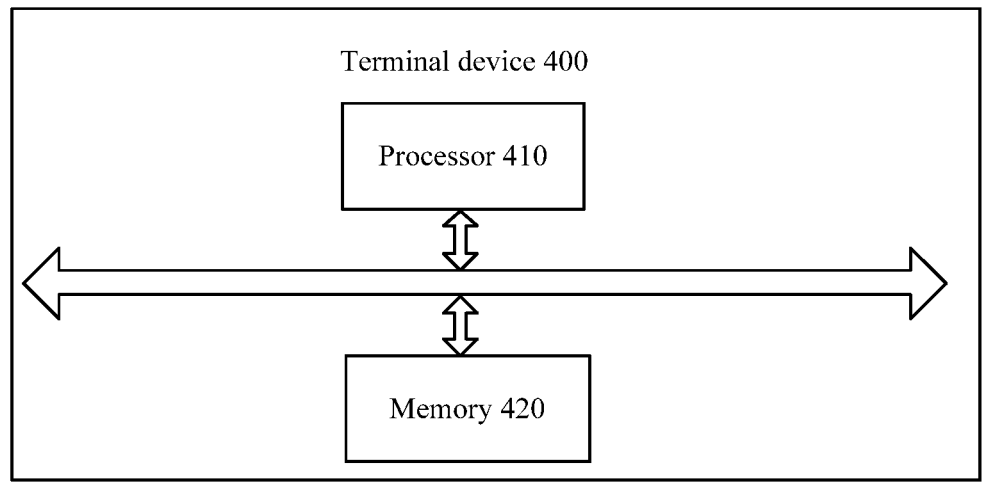
FIG. 14 is a schematic block diagram of a terminal device according to an embodiment of this application.

FIG. 14 is a schematic block diagram of a terminal device 400 according to an embodiment of this application. It should be understood that the terminal device embodiment mutually corresponds to the method embodiment, and for similar descriptions, refer to the method embodiment. As shown in FIG. 14, the terminal device 400 includes a processor 410 and a memory 420 that stores a program to be executed by the processor 410.

The processor 410 is configured to:
detect a PDCCH, where the PDCCH includes DCI;
determine a processing manner set, where the processing manner set includes a plurality of possible DCI formats and a plurality of processing manners, where each possible DCI format corresponds to a processing manner; and
decode the PDCCH by sequentially using the possible DCI formats and the corresponding processing manners that are in the processing manner set.

The terminal device provided in this embodiment of this application can resolve a problem of a failure in blind detection on DCI caused by a nested encoding feature of a polar code. When the terminal device cannot determine the format of the DCI sent by a network device, the terminal device uses processing related to DCI formats and uses a mapping relationship between an operation or information and a DCI format, to resolve the problem of the failure in blind detection on DCI. The terminal device separately decodes the PDCCH in processing manners that correspond to possible formats of the DCI. When a processing manner of the terminal device in which decoding can be performed correctly is determined, a type of the DCI can be determined, so that content of the DCI can be parsed.

Components in the terminal device 400 are in communication connection. That is, the processor 410 communicates with the memory 420 by using an internal connection path, to transfer a control and/or data signal. It should be noted that the foregoing method embodiments of this application may be applied to a processor, or implemented by a processor. The processor may be an integrated circuit chip and has a signal processing capability. In one process, operations in the foregoing method embodiments can be implemented by using a hardware integrated logical circuit in the processor, or by using instructions in a form of software. The processor may be a central processing unit (CPU), a network processor (NP), a combination of a CPU and an NP, a digital signal processor (DSP), an application-specific integrated circuit (ASIC), a field programmable gate array (FPGA), another programmable logic device, a discrete gate, a transistor logic device, or a discrete hardware component. It may implement or perform the methods, the steps, the operations, and logical block diagrams that are disclosed in the embodiments of this application. The general purpose processor may be a microprocessor, or the processor may be any conventional processor or the like. Operations of the methods disclosed with reference to the embodiments of this application may be directly executed and accomplished by using a hardware decoding processor, or may be executed and accomplished by using a combination of hardware and software modules in the decoding processor. The software module may be located in a mature storage medium in the art, such as a random access memory, a flash memory, a read-only memory, a programmable read-only memory, an electrically erasable programmable memory, or a register. The storage medium is located in a memory, and the processor reads information in the memory and completes the operations in the foregoing methods in combination with hardware of the processor.

In one embodiment, the processor 410 is configured to:
descramble a CRC code of the DCI by using a sequence related to a format of the DCI that corresponds to the processing manner; and/or
perform bit de-reordering and/or de-resetting that corresponds to the format of the DCI that corresponds to the processing manner on all or a part of the CRC code of the DCI.

In one embodiment, the processor 410 is configured to:
descramble a RNTI of the DCI by using a sequence that corresponds to the format of the DCI that corresponds to the processing manner; and/or
perform bit de-reordering and/or de-resetting that corresponds to the format of the DCI that corresponds to the processing manner on all or a part of a RNTI of the DCI, and descramble the cyclic redundancy check CRC code of the DCI by using the processed RNTI.

In one embodiment, the processor 410 is configured to:

descramble, by using the sequence that corresponds to the format of the DCI that corresponds to the processing manner, all or some of frozen bits used in polar code decoding on the PDCCH; and/or perform bit de-reordering and/or de-resetting that corresponds to the format of the DCI that corresponds to the processing manner on all or some of frozen bits used in polar code decoding on the PDCCH.

In one embodiment, the processor 410 is configured to:

search a mapping table based on the plurality of possible DCI formats, and determine the plurality of processing manners that are included in the descrambling manner set and that correspond to the plurality of possible DCI formats, where the mapping table is stored by the terminal device and the network device separately before the terminal device detects the PDCCH.

Figure 15:
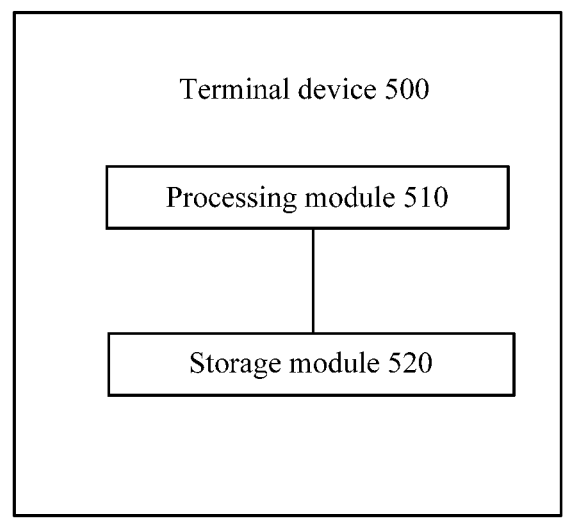
FIG. 15 is a schematic block diagram of a terminal device according to another embodiment of this application.

It should be noted that in this embodiment of this application, the processor 410 may be implemented by a processing module, and the memory 420 may be implemented by a storage module. As shown in FIG. 15, a terminal device 500 may include a processing module 510 and a storage module 520.

The terminal device 400 shown in FIG. 14 or the terminal device 500 shown in FIG. 15 can implement the processes implemented in the foregoing embodiments in FIG. 4, FIG. 7, FIG. 9, and FIG. 11. To avoid repetition, details are not described herein again.

An embodiment of this application further provides a computer readable medium, configured to store computer program code. The computer program includes an instruction used to perform the foregoing information transmission method in the embodiments of this application in FIG. 4 to FIG. 11. The readable medium may be a read-only memory (ROM) or a random access memory (RAM). This is not limited in this embodiment of this application.

It should be understood that, the term "and/or" and "at least one of A or B" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

A person of ordinary skill in the art may be aware that, in combination with the examples described in the embodiments disclosed in this specification, units and algorithm operations may be implemented by electronic hardware or a combination of computer software and electronic hardware. Whether the functions are performed by hardware or software depends on particular applications and design constraints of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of this application essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps or operations of the methods described in the embodiments of this application. The foregoing storage medium includes: any medium that can store program code, such as a USB flash drive, a removable hard disk, a ROM, a RAM, a magnetic disk, or an optical disc.

The foregoing descriptions are merely example implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for information transmission comprising:
    detecting, by a terminal device, a physical downlink control channel (PDCCH), wherein the PDCCH comprises downlink control information (DCI);
    determining, by the terminal device, a processing manner set, wherein the processing manner set comprises a plurality of possible DCI formats and a plurality of processing manners, wherein each possible DCI format corresponds to a processing manner, wherein the determining the processing manner set includes searching, by the terminal device, a mapping table based on the plurality of possible DCI formats, and determining the plurality of processing manners comprised in a descrambling manner set and that correspond to the plurality of possible DCI formats, wherein the mapping table is stored by the terminal device and a network device separately before the terminal device detects the PDCCH; and
    decoding, by the terminal device, the PDCCH by sequentially using the possible DCI formats and the corresponding processing manners in the processing manner set, wherein a first processing manner of the processing manner set comprises:
descrambling, by using a sequence that corresponds to a format of the DCI that corresponds to the first processing manner, all or some of frozen bits used in polar code decoding on the PDCCH; or
performing bit de-reordering or de-resetting that corresponds to the format of the DCI that corresponds to the first processing manner on all or some of frozen bits used in polar code decoding on the PDCCH.

2. The method according to claim 1, wherein a second processing manner of the processing manner set comprises:
descrambling a cyclic redundancy check (CRC) code of the DCI by using a sequence related to a format of the DCI that corresponds to the second processing manner; or
performing bit de-reordering or de-resetting that corresponds to the format of the DCI that corresponds to the second processing manner on all or a part of the CRC code of the DCI.

3. The method according to claim 1, wherein a third processing manner of the processing manner set comprises:
descrambling a radio network temporary identifier (RNTI) of the DCI by using a sequence that corresponds to a format of the DCI that corresponds to the third processing manner; or
performing bit de-reordering or de-resetting that corresponds to the format of the DCI that corresponds to the third processing manner on all or a part of the RNTI of the DCI, and descrambling a CRC code of the DCI by using the RNTI.

4. A network device comprising:
a processor; and
a memory that stores a program to be executed by the processor, the processor configured to:
generate downlink control information (DCI);
determine a corresponding processing manner based on a format of the DCI;
search a mapping table based on the format of the DCI to determine the corresponding processing manner, including determining a plurality of processing manners comprised in a descrambling manner set and that correspond to a plurality of possible DCI formats, wherein the mapping table is stored by the network device and a terminal device separately before the network device sends the PDCCH;
perform processing in the corresponding processing manner in an encoding process of the DCI; and
send the processed DCI over a physical downlink control channel (PDCCH),
wherein the processor is further configured to:
scramble, by using a sequence that corresponds to the format of the DCI, all or some of frozen bits used in polar code encoding on the DCI; or
perform bit reordering or resetting that corresponds to the format of the DCI on all or some of frozen bits used in polar code encoding on the DCI.

5. The network device according to claim 4, wherein the processor is further configured to:
scramble a cyclic redundancy check (CRC) code of the DCI using a sequence that corresponds to the format of the DCI; or
perform bit reordering or resetting that corresponds to the format of the DCI on all or a part of the CRC code of the DCI.

6. The network device according to claim 4, wherein the processor is further configured to:
scramble a radio network temporary identifier (RNTI) of the DCI by using a sequence that corresponds to the format of the DCI; or
perform bit reordering or resetting that corresponds to the format of the DCI on all or a part of the RNTI, and scramble the CRC code of the DCI by using the RNTI.

7. A terminal device comprising:
a processor; and
a memory that stores a program to be executed by the processor, the processor configured to:
detect a physical downlink control channel (PDCCH), wherein the PDCCH comprises downlink control information (DCI);
determine a processing manner set, wherein the processing manner set comprises a plurality of possible DCI formats and a plurality of processing manners, wherein each possible DCI format corresponds to a processing manner, wherein determining the processing manner set includes searching a mapping table based on the plurality of possible DCI formats, and determining the plurality of processing manners comprised in a descrambling manner set and that correspond to the plurality of possible DCI formats, wherein the mapping table is stored by the terminal device and a network device separately before the terminal device detects the PDCCH; and
decode the PDCCH by sequentially using the possible DCI formats and the corresponding processing manners in the processing manner set,
wherein the processor is further configured to:
descramble, by using a sequence that corresponds to a format of the DCI that corresponds to a first processing manner, all or some of frozen bits used in polar code decoding on the PDCCH; or
perform bit de-reordering or de-resetting that corresponds to the format of the DCI that corresponds to the first processing manner on all or some of frozen bits used in polar code decoding on the PDCCH.

8. The terminal device according to claim 7, wherein the processor is further configured to:
descramble a cyclic redundancy check (CRC) code of the DCI by using a sequence related to a format of the DCI that corresponds to a second processing manner; or
perform bit de-reordering or de-resetting that corresponds to the format of the DCI that corresponds to the second processing manner on all or a part of the CRC code of the DCI.

9. The terminal device according to claim 7, wherein the processor is further configured to:
descramble a radio network temporary identifier (RNTI) of the DCI by using a sequence that corresponds to a format of the DCI that corresponds to a third processing manner; or
perform bit de-reordering or de-resetting that corresponds to the format of the DCI that corresponds to the third processing manner on all or a part of the RNTI of the DCI, and descramble the CRC code of the DCI by using the RNTI.

* * * * *